(12) United States Patent
Abe

(10) Patent No.: US 9,312,959 B2
(45) Date of Patent: Apr. 12, 2016

(54) TRANSMISSION DEVICE, TRANSMISSION METHOD, AND COMMUNICATION SYSTEM

(75) Inventor: Junichi Abe, Tokyo (JP)

(73) Assignee: NEC CORPORATION, Tokyo (JP)

(*) Notice: Subject to any disclaimer, the term of this patent is extended or adjusted under 35 U.S.C. 154(b) by 139 days.

(21) Appl. No.: 14/129,745

(22) PCT Filed: Jul. 5, 2012

(86) PCT No.: PCT/JP2012/067764
§ 371 (c)(1),
(2), (4) Date: Dec. 27, 2013

(87) PCT Pub. No.: WO2013/008871
PCT Pub. Date: Jan. 17, 2013

(65) Prior Publication Data
US 2014/0147112 A1  May 29, 2014

(30) Foreign Application Priority Data
Jul. 11, 2011 (JP) .................................. 2011-153154

(51) Int. Cl.
*H04B 10/08* (2006.01)
*H04B 10/516* (2013.01)
(Continued)

(52) U.S. Cl.
CPC ............... *H04B 10/516* (2013.01); *H03M 1/70* (2013.01); *H04B 10/07* (2013.01);
(Continued)

(58) Field of Classification Search
CPC ..... H04B 10/516; H04B 10/612; H04B 10/07
See application file for complete search history.

(56) References Cited

U.S. PATENT DOCUMENTS

2003/0227964 A1   12/2003  Honkanen
2009/0154442 A1*   6/2009  Kang et al. ................... 370/344
(Continued)

FOREIGN PATENT DOCUMENTS

JP         1-191521 A      8/1989
JP      2007-267001 A    10/2007
JP      2008-124893 A     5/2008

OTHER PUBLICATIONS

Doug McGhan, et al., "5120-km RZ-DPSK Transmission Over G.652 Fiber at 10 Gb/s Without Optical Dispersion Compensations", IEEE Photonics Technology Letters, Jan. 15, 2006, vol. 18, No. 2, pp. 400-402.

(Continued)

*Primary Examiner* — Dzung Tran

(57) ABSTRACT

In order to provide a transmission device which can resolve the deterioration in transmission characteristics due to lack of the resolution of a D/A converter in a high speed and large capacity digital communication, a transmission device according to an exemplary aspect of the present invention includes an encoding unit encoding input data; an unequal-interval quantization unit quantizing an output signal from the encoding unit by a quantization level number based on a resolution of a subsequent digital-to-analog conversion unit by using an unequally spaced quantization level interval based on the output signal; the digital-to-analog conversion unit converting an output signal from the unequal-interval quantization unit into an analog signal; an output level adjustment unit adjusting an output level of the digital-to-analog conversion unit so as to compensate a difference between a predetermined initial transfer function and a transfer function of the unequal-interval quantization unit; and a modulation unit generating a transmission signal based on an output signal of the digital-to-analog conversion unit adjusted by the output level adjustment unit.

17 Claims, 16 Drawing Sheets

(51) Int. Cl.
  *H04B 10/2513* (2013.01)
  *H04B 10/50* (2013.01)
  *H04B 10/07* (2013.01)
  *H04B 10/61* (2013.01)
  *H04L 27/26* (2006.01)
  *H04B 10/548* (2013.01)
  *H03M 1/70* (2006.01)

(52) U.S. Cl.
  CPC ..... *H04B 10/25137* (2013.01); *H04B 10/5053* (2013.01); *H04B 10/548* (2013.01); *H04B 10/612* (2013.01); *H04L 27/2627* (2013.01); *H04B 2210/254* (2013.01)

(56) References Cited

U.S. PATENT DOCUMENTS

2012/0076234 A1* 3/2012 Kim et al. .................... 375/295

2014/0056583 A1* 2/2014 Giddings et al. ................ 398/44

OTHER PUBLICATIONS

Yuriy M. Greshishchev, et al., "A 56GS/s 6b DAC in 65nm CMOS with 256x6b Memory", IEEE International Solid-State Circuits Conference, ISSCC 2011, Session 10, 10.8, Feb. 22, 2011, pp. 194-195.

International Search Report for PCT Application No. PCT/JP2012/067764, mailed on Aug. 7, 2012.

European Search Report of EP Application No. 12812131.6 dated Feb. 20, 2015.

Xianbin Wang et al: 11 Reduction of 1-W Peak-to-Average Power Ratio of OFDM System Using a Companding Technique, IEEE Transactions on Broadcasting, IEEEService Center, Piscataway, NJ, US,val. 45, No. 3, Sep. 1999, pp. 303-307, XP011083075,ISSN: 0018-9316, DOI: 10.1109/11.796272.

* cited by examiner

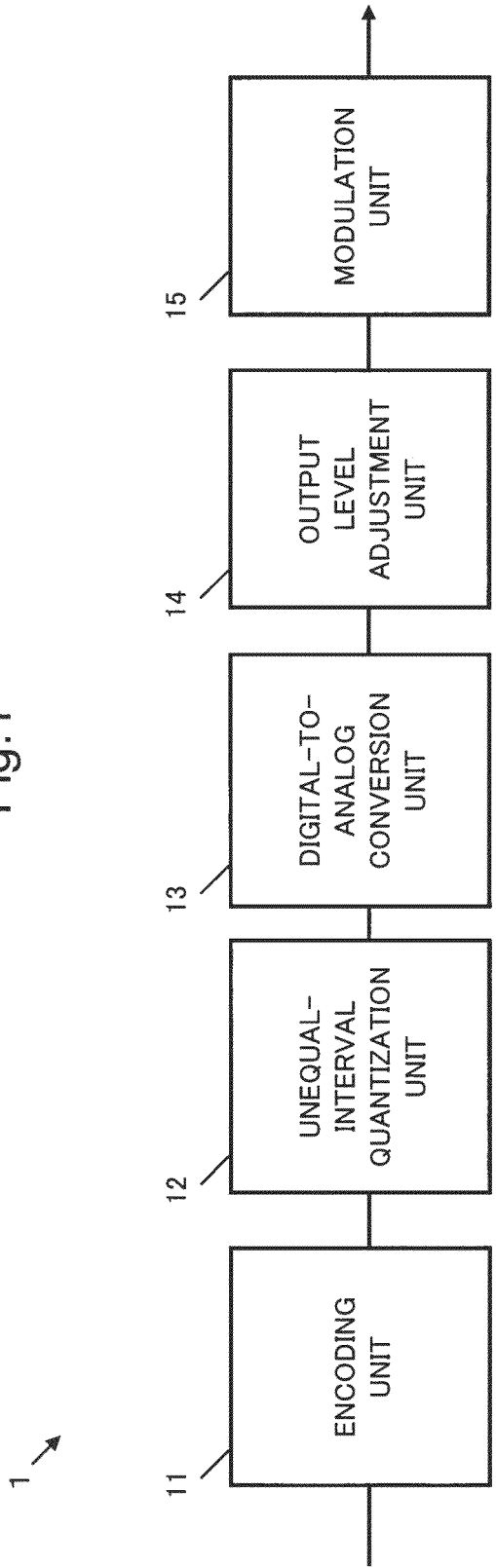

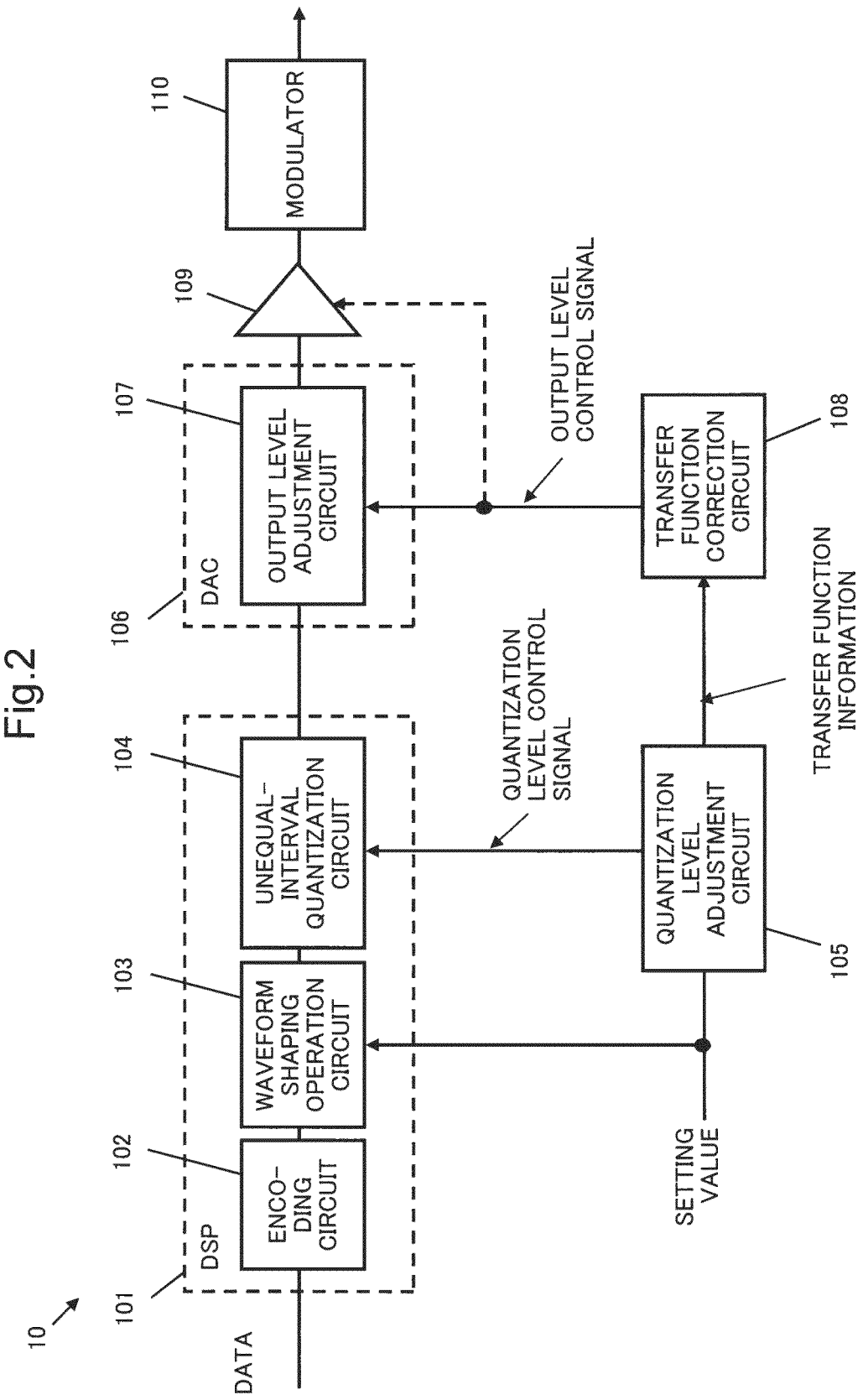

Fig.3A  Fig.3B  Fig.3C
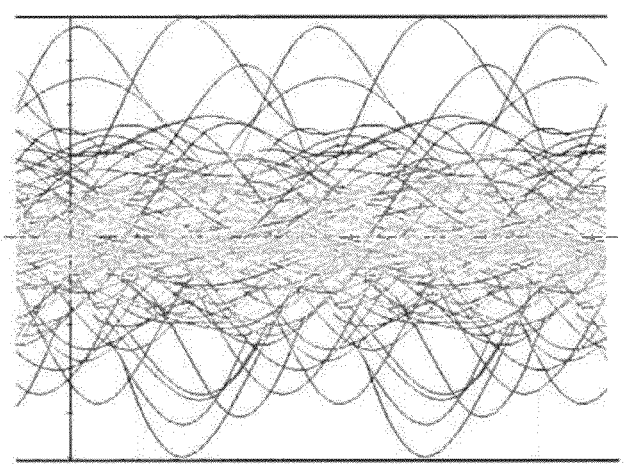
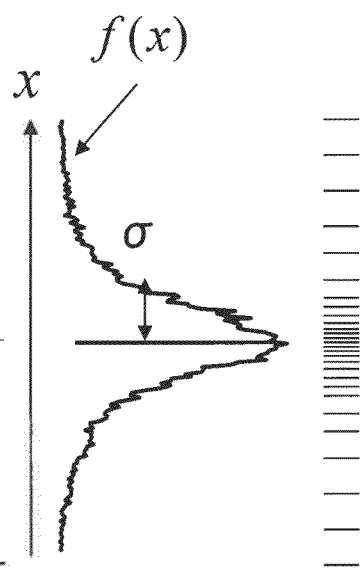

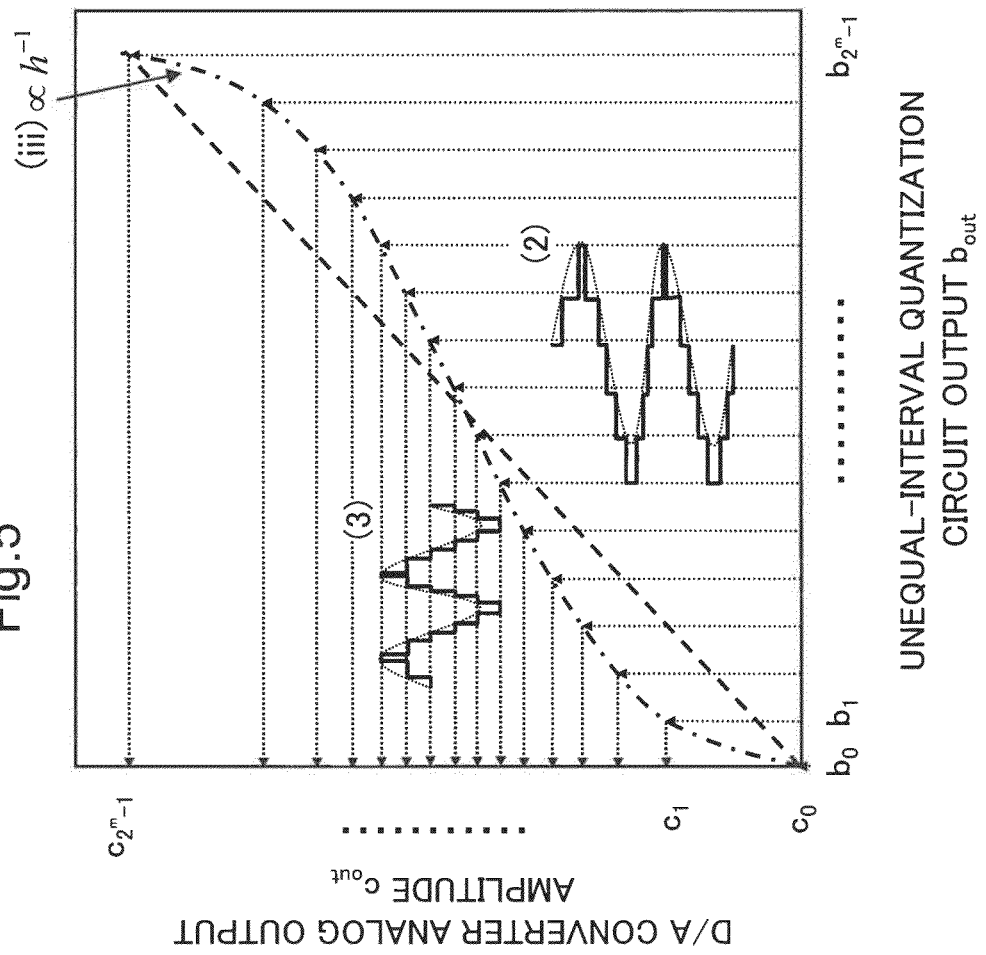

WAVEFORM SHAPING OPERATION
CIRCUIT OUTPUT $a_{out}$

WAVEFORM SHAPING OPERATION
CIRCUIT OUTPUT $a_{out}$

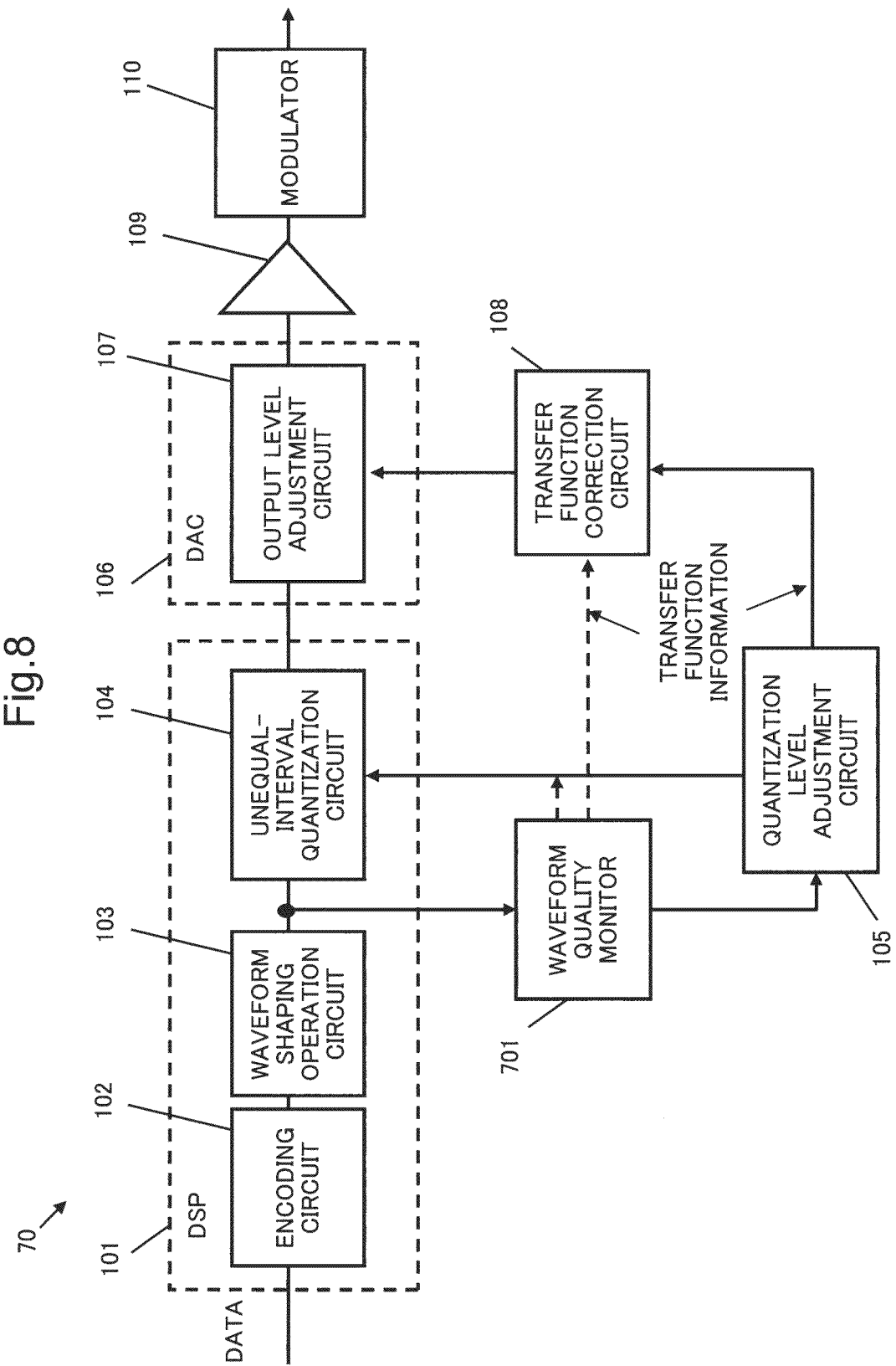

TRANSMISSION DEVICE, TRANSMISSION METHOD, AND COMMUNICATION SYSTEM

This application is a National Stage Entry of PCT/JP2012/067764 filed Jul. 5, 2012, which claims priority from Japanese Patent Application 2011-153154 filed Jul. 11, 2011, the contents of all of which are incorporated herein by reference, in their entirety.

TECHNICAL FIELD

The present invention relates to a transmission device, a transmission method, and a communication system which are used for digital communications.

BACKGROUND ART

A high-speed D/A (digital to analog) converter and a high-speed A/D (analog to digital) converter have been used in communication devices at a transmission side and a reception side with an increase in speed and capacity of digital communication. With such increase in speed of the D/A converter and the A/D converter, the communication devices at the transmission side and the reception side have come to be able to perform various compensation processes and an advanced waveform equalization process by means of a DSP (Digital Signal Processing).

For example, in digital coherent optical communication, a communication device is known which performs processes such as the compensation process for frequency/phase offset, the compensation process for polarization fluctuation, and the compensation process for chromatic dispersion, or the like by a DSP. As an example, in Non Patent Literature 1, a reception device is described which performs the compensation process for chromatic dispersion to a reception signal by a DSP.

In Patent Literature 1 and Patent Literature 2, a transmission device is described which performs the compensation process for chromatic dispersion using a pre-equalization technology to signals to be transmitted by a DSP. As shown in FIG. 14, the transmission device encodes input data in an encoding circuit, and then performs in advance a waveform shaping process to cancel waveform distortion arising in a transmission line by a pre-equalization operation circuit based on an amount of chromatic dispersion of the transmission line. The transmission device outputs, using the D/A converter, an analog signal proportional to a value indicated by a digital signal output from the pre-equalization operation circuit, and drives an I/Q modulator through a driver amplifier to generate an optical transmission signal.

FIG. 15A shows an example of a transmission waveform of the optical signal transmitted from the transmission device. FIG. 15B shows an example of a reception waveform of the optical signal input into a reception device after the optical signal with the transmission waveform shown in FIG. 15A has been transmitted. Thus, it turns out that a good reception waveform with the chromatic dispersion in the transmission line compensated can be obtained by using the transmission waveform to which a pre-equalization operation has been performed.

Such chromatic dispersion compensation process by the DSP replaces a conventional chromatic dispersion compensation process using a dispersion compensating fiber. As seen above, with an increase in speed of the D/A converter and the A/D converter, it has become possible to perform the various compensation processes by means of the DSP in a transmission side or a reception side, which have been controlled by analog processes. This enables the communication device to improve and its cost to decrease, and enhances the practicality of digital coherent communications.

Non Patent Literature 2 describes an example of a D/A converter used in the transmission device in the high speed and large capacity digital communication which is represented by such digital coherent communication. The D/A converter is configured so that an output level interval for each code value of the input will be as equal as possible. As a result, the D/A converter has a linear transfer characteristic as shown in FIG. 16. In FIG. 16, when code values represented by an input waveform (a) are input into the D/A converter, the D/A converter outputs an analog signal represented by an output waveform (b). Thus, the D/A converter can perform the D/A conversion with high-resolution (effective number of bit: ENOB) and low distortion.

Patent Literature 1: Japanese Patent Application Laid-Open Publication No. 2007-267001
Patent Literature 2: Japanese Patent Application Laid-Open Publication No. 2008-124893
Non Patent Literature 1: Doug McGhan, Charles Laperle, Alexander Savchenko, Chuandong Li, Gary Mak, and Maurice O'Sullivan "5120-km RZ-DPSK Transmission Over G.652 Fiber at 10 Gb/s Without Optical Dispersion Compensation", IEEE Photon. Technol. Lett., vol. 17, no. 3, pp. 714-716, March 2005.
Non Patent Literature 2: Yurity M. Greshchev, Daniel Pollex, Shing-Chi Wang, Marinette Besson, Philip Flemeke, Stefan Szilagyi, Jorge Aguirre, Chris Falt, Naim Ben-Hamida, Robert Gibbins, Peter Schvan, "A 56 GS/s 6 b DAC in 65 nm CMOS with 256×6 b Memory", ISSCC Dig. Tech. Papers, pp. 544-634, February 2011.

DISCLOSURE OF INVENTION

Problem to be Solved by the Invention

With a further increase in the demand for a high speed and large capacity network, a D/A converter with higher speed and higher resolution is required for the transmission device for the digital communication. For example, in a next generation optical communication system in which a communication speed exceeds 100 Gbps (bits per second), it is supposed that a multi-level modulation method or an OFDM (Orthogonal Frequency-Division Multiplexing) modulation method will be adopted. A D/A converter with higher speed and higher resolution is required for the transmission device used in such optical communication system.

In an ultrafast D/A converter whose sampling rate exceeds several tens of GSps (Samples per second), however, the influence of the variation in the characteristics of elements composing the D/A converter becomes larger. Using the configuration described in Non Patent Literature 2 mentioned above, therefore, it is difficult to control the output level interval for each code value of the input with a high degree of accuracy and at regular intervals due to the limitation of the circuit speed and the power consumption. Accordingly, it is difficult for the D/A converter having the above-mentioned configuration to satisfy both high resolution and high speed at the same time.

Lack of the resolution of the D/A converter causes problems for the communication in which it is required to transmit and receive a signal having a complex waveform with a high degree of accuracy such as, in particular, communication under low SNR (signal-to-noise ratio), communication using an optical signal to which high chromatic dispersion is added, communication adopting multi-level modulation or OFDM, or the like. For example, in such communication, even when the transmission device performs a compensation process for waveform distortion by means of a DSP in advance, the effect of the compensation process for waveform distortion cannot be sufficiently obtained by the DSP if the resolution of the D/A converter is insufficient. Accordingly, in such transmission devices, a problem has occurred that system performance deteriorates due to lack of the resolution of the D/A converter.

The present invention has been devised in order to solve the above-mentioned problem, and the object of the present invention is to provide a transmission device which can resolve the deterioration in transmission characteristics due to lack of the resolution of a D/A converter in a high speed and large capacity digital communication.

Means for Solving a Problem

A transmission device according to an exemplary aspect of the present invention includes an encoding unit encoding input data; an unequal-interval quantization unit quantizing an output signal from the encoding unit by a quantization level number based on a resolution of a subsequent digital-to-analog conversion unit by using an unequally spaced quantization level interval based on the output signal; the digital-to-analog conversion unit converting an output signal from the unequal-interval quantization unit into an analog signal; an output level adjustment unit adjusting an output level of the digital-to-analog conversion unit so as to compensate a difference between a predetermined initial transfer function and a transfer function of the unequal-interval quantization unit; and a modulation unit generating a transmission signal based on an output signal of the digital-to-analog conversion unit adjusted by the output level adjustment unit.

A communication system according to an exemplary aspect of the present invention includes the above-mentioned transmission device and a reception device receiving data transmitted from the transmission device.

A transmission method according to an exemplary aspect of the present invention includes the steps of: encoding input data; quantizing an encoded signal by a quantization level number based on a resolution of a subsequent digital-to-analog conversion process by using an unequally spaced quantization level interval based on the signal; in converting an quantized signal into an analog signal, adjusting an output level of the analog signal so as to compensate a difference between a transfer function expressing an unequal-interval quantization and an initial transfer function set in advance; and generating a transmission signal based on an adjusted analog signal.

Effect of the Invention

According to the present invention, a transmission device can be provided which can resolve the deterioration in transmission characteristics due to lack of the resolution of a D/A converter in a high speed and large capacity digital communication.

BRIEF DESCRIPTION OF THE DRAWINGS

FIG. 1 is a functional block diagram of a transmission device according to the first exemplary embodiment of the present invention.

FIG. 2 is a functional block diagram of a transmission device according to the second exemplary embodiment of the present invention.

FIG. 3A is a figure showing an example of a waveform of a signal output from a waveform shaping circuit according to the second exemplary embodiment of the present invention.

FIG. 3B is a figure showing an amplitude frequency distribution of the waveform shown in FIG. 3A.

FIG. 3C is a figure to explain an unequally spaced quantization level interval set based on the amplitude frequency distribution shown in FIG. 3B.

FIG. 5 is a figure to explain a transfer function of a D/A converter whose output level is adjusted by an output level adjustment unit according to the second exemplary embodiment of the present invention.

FIG. 8 is a functional block diagram of another aspect of a transmission device according to the second exemplary embodiment of the present invention.

DESCRIPTION OF EMBODIMENTS

Figure 4:
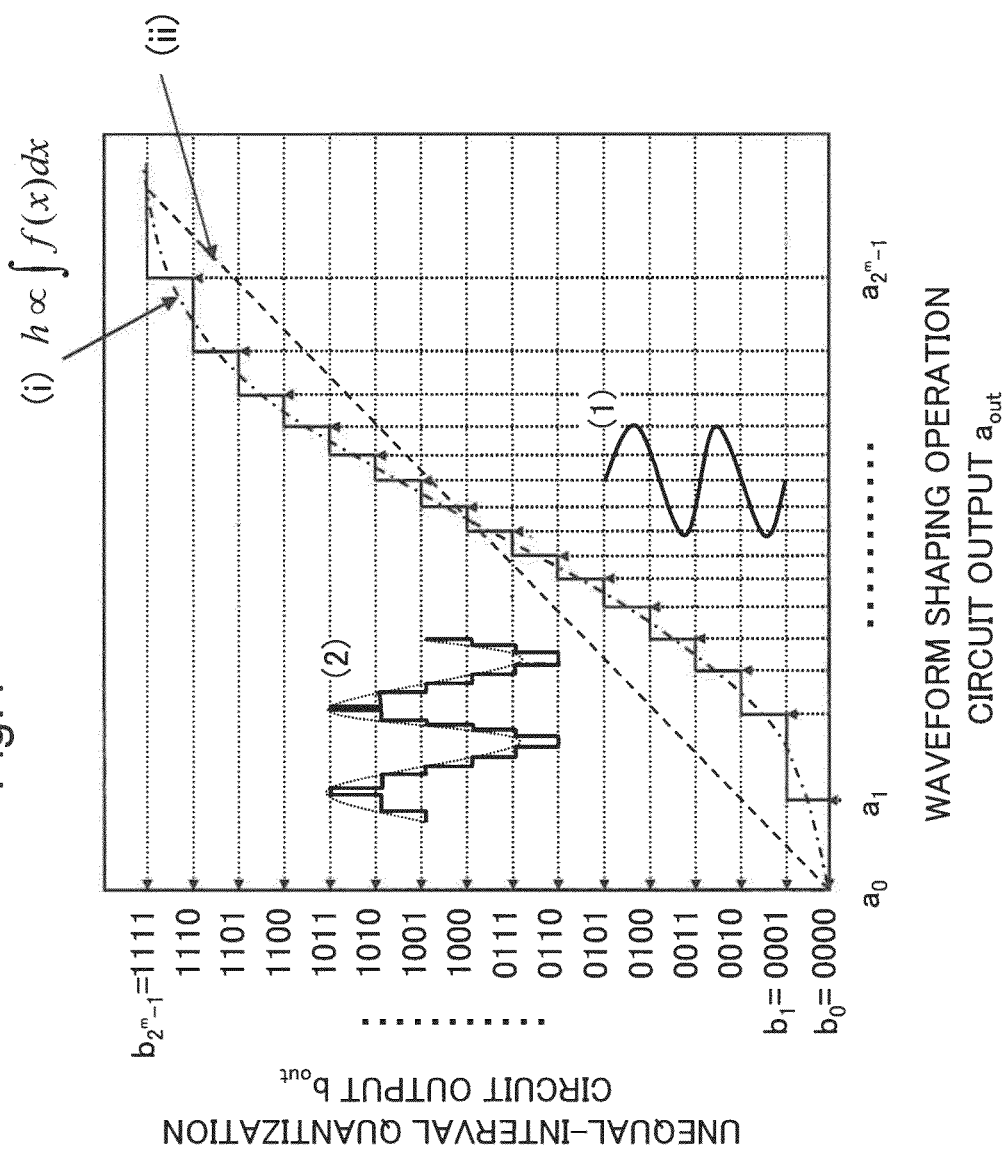
FIG. 4 is a figure to explain a transfer function of an unequal-interval quantization circuit according to the second exemplary embodiment of the present invention.

The exemplary embodiments of the present invention will be described in detail with reference to drawings below.

The First Exemplary Embodiment

The configuration of a transmission device 1 according to the first exemplary embodiment of the present invention is shown in FIG. 1. In FIG. 1, the transmission device 1 includes an encoding unit 11, an unequal-interval quantization unit 12, a digital-to-analog conversion unit 13, an output level adjustment unit 14, and a modulation unit 15.

The encoding unit 11 encodes input data based on a predetermined modulation method adopted for the transmission device 1.

The unequal-interval quantization unit 12 quantizes the output signal from the encoding unit 11 by application of the unequally spaced quantization level interval based on the output signal. Here, the unequally spaced quantization level interval means that at least one quantization level interval, which is included among the quantization level intervals obtained by dividing a range of the values that the output signal from the encoding unit 11 can take by a number based on the quantization level, is different from another quantization level interval. For example, the unequal-interval quantization unit 12 may set the quantization level interval in an unequally spaced interval so as to have more densely spaced interval in a part showing a waveform for which the regeneration is required with a high degree of accuracy at the reception side based on the shape of the waveform of the output signal from the encoding unit 11. The waveform described above means a waveform representing a time variation in digital values that is indicated by the digital signal output from the encoding unit 11, and is represented as simply waveform below.

It is assumed that the quantization level of the output signal from the unequal-interval quantization unit 12 corresponds to an input bit precision of the digital-to-analog conversion unit 13. For example, it is assumed that the output signal from the encoding unit 11 has l bits and the input bits of the digital-to-analog conversion unit 13 are equal to m bits. In this case, the unequal-interval quantization unit 12 quantizes the output signal having l bits in width from the encoding unit 11 into $2^m$ steps with the unequally spaced quantization level interval.

For example, it is acceptable for the unequal-interval quantization unit 12 to set the quantization level interval so as to be inversely proportional to the frequency distribution of an amplitude level of the output waveform from the encoding unit 11. Alternatively, it is acceptable for the unequal-interval quantization unit 12 to set the quantization level interval so as to be inversely proportional to an absolute value of the gradient of the frequency distribution. Alternatively, in order to perform a digital signal processing for a sharp signal changing, it is also acceptable for the unequal-interval quantization unit 12 to quantize more densely the region in which the waveform changes sharply, and more sparsely the region in which the waveform changes gradually.

The digital-to-analog conversion unit 13 converts the digital signal output from the unequal-interval quantization unit 12 into an analog signal. At that time, the output level of the converted analog signal is adjusted by the output level adjustment unit 14.

The output level adjustment unit 14 adjusts the output level of the digital-to-analog conversion unit 13 so as to compensate a difference between the predetermined initial transfer function and the transfer function of the unequal-interval quantization unit 12. Here, the transfer function of the unequal-interval quantization unit 12 is defined as a function expressing the relationship between the input value and the output value of the unequal-interval quantization unit 12. It is acceptable to set in advance a transfer function in a case where the output signal from the encoding unit 11 is quantized by an equally spaced interval as the initial transfer function, for example. Moreover, it is also acceptable to set a transfer function in a case where it is quantized by a sufficiently large quantization level and equally spaced interval as the initial transfer function. In this case, the initial transfer function is expressed as a linear transfer function. The difference between the initial transfer function and the transfer function of the unequal-interval quantization unit 12 means a difference between the output value by using the transfer function of the unequal-interval quantization unit 12 and the output value by using the initial transfer function for the same input signal.

The output level adjustment unit 14 adjusts the output level of the digital-to-analog conversion unit 13 so as to compensate the difference. Here, compensating the difference means bringing the output level of the analog signal that is obtained by converting the output value from the unequal-interval quantization unit 12 by the digital-to-analog conversion unit 13 close to the output level of the analog signal that is obtained using the digital-to-analog conversion unit 13 by converting the output value from the unequal-interval quantization unit 12 in a case where the initial transfer function is used. That is to say, the difference between the transfer function of the unequal-interval quantization unit 12 and the initial transfer function is compensated by an output level adjustment component by the output level adjustment unit 14.

The output level adjustment unit 14, therefore, adjusts the interval of the output level for the input value at unequal intervals. For example, the output level adjustment unit 14 can adjust the output level of the digital-to-analog conversion unit 13 so that the difference between the transfer function of the digital-to-analog conversion unit 13 and the initial transfer function may have an inverse characteristic to the difference between the transfer function of the unequal-interval quantization unit 12 and the initial transfer function.

As a result, the initial transfer function can be obtained by the combination of the unequal-interval quantization unit 12 and the digital-to-analog conversion unit 13 whose output level is adjusted. In other words, the output signal from the encoding unit 11 is converted into the analog signal based on the initial transfer function. Moreover, by being quantized once by the unequal-interval quantization unit 12, the output signal from the encoding unit 11 is converted into the analog signal at higher resolution in the region where a dense quantization level interval is set.

It is unnecessary, however, for the output level adjustment unit 14 to adjust the output level of the digital-to-analog conversion unit 13 so as to have the above-mentioned inverse characteristic precisely. It is only necessary for the output level adjustment unit 14 to operate so as to obtain a transfer function approximately equal to an ideal initial transfer function by means of the combination of the unequal-interval quantization unit 12 and the digital-to-analog conversion unit 13 whose output level is adjusted.

The modulation unit 15 generates a transmission signal based on the output signal of the digital-to-analog conversion unit 13 and transmits it to a transmission line.

The operation of the transmission device 1 configured above will be described.

First, the encoding unit 11 encodes the input data based on a predetermined modulation method. Next, the unequal-interval quantization unit 12 sets the unequally spaced quantization level interval to quantize the output signal based on the output signal from the encoding unit 11. At this time, it is acceptable for the unequal-interval quantization unit 12 to set the quantization level interval in the unequally spaced interval so as to have more densely spaced interval in a part showing a waveform for which the regeneration is required with a high degree of accuracy at the reception side.

Next, the unequal-interval quantization unit 12 quantizes the output signal from the encoding unit 11 by using the set quantization level interval with a quantization level number based on a resolution of the digital-to-analog conversion unit 13.

Next, the digital-to-analog conversion unit 13 converts the digital signal output from the unequal-interval quantization unit 12 into the analog signal. At this time, the output level adjustment unit 14 obtains the information concerning the transfer function from the unequal-interval quantization unit 12. The output level adjustment unit 14 adjusts the output level of the digital-to-analog conversion unit 13 so that the difference between the transfer function of the digital-to-analog conversion unit 13 and the initial transfer function may have an approximate inverse characteristic to the difference between the transfer function of the unequal-interval quantization unit 12 and the initial transfer function.

Next, the modulation unit 15 generates the transmission signal based on the output signal of the digital-to-analog conversion unit 13 whose output level is adjusted by the output level adjustment unit 14 and transmits it to the transmission line.

This is the end of the explanation of the operation of the transmission device 1.

Next, the effects of the first exemplary embodiment of the present invention will be described.

The transmission device according to the first exemplary embodiment of the present invention can resolve the deterioration in transmission characteristics due to lack of the resolution of the D/A converter in a high speed and large capacity digital communication.

The reason is because the unequal-interval quantization unit quantizes the signal obtained by encoding the input data with the unequally spaced quantization level interval based on the signal, and then the digital-to-analog conversion unit converts it into the analog signal. As a result, the transmission device according to the first exemplary embodiment of the present invention can improve the effective resolution in the region quantized by denser quantization level interval in comparison with a case where the encoded signal is directly input into the digital-to-analog conversion unit.

The output level adjustment unit adjusts the output level of the digital-to-analog conversion unit so as to compensate the difference from the ideal initial transfer function which is generated due to the unequal-interval quantization by the unequal-interval quantization unit. As a result, it is possible to keep the conversion characteristics approximately equal to those of the ideal initial transfer function. As mentioned above, the transmission device according to the first exemplary embodiment of the present invention can improve the effective resolution of the D/A converter keeping a high linearity.

The Second Exemplary Embodiment

Next, the second exemplary embodiment of the present invention will be described in detail with reference to the drawings. In each drawing referred to in the explanation of the present exemplary embodiment, the same reference numbers are used for the same configurations as those in the first exemplary embodiment of the present invention and the description of the configurations will be omitted.

First, the configuration of a transmission device 10 according to the second exemplary embodiment of the present invention is shown in FIG. 2. In FIG. 2, the transmission device 10 includes a DSP 101, a quantization level adjustment circuit 105, a D/A converter 106, an output level adjustment circuit 107, a transfer function correction circuit 108, an output amplifier 109, and a modulator 110. The DSP 101 includes an encoding circuit 102, a waveform shaping operation circuit 103, and an unequal-interval quantization circuit 104. The DSP 101 is a digital circuit which performs a digital signal processing in the transmission device 10.

The encoding circuit 102 encodes data input into the DSP 101 according to a modulation method used in the transmission device 10.

The waveform shaping operation circuit 103 performs a waveform shaping processing of the signal encoded by the encoding circuit 102 so that the transmission characteristics of the transmission device 10 may become preferable. For example, it is acceptable for the waveform shaping operation circuit 103 to perform a process for pre-compensating waveform distortion generated in a transmission line to the signal encoded by the encoding circuit 102.

The encoding circuit 102 and the waveform shaping operation circuit 103 compose an exemplary embodiment of the encoding unit according to the present invention.

The unequal-interval quantization circuit 104 quantizes the output signal from the waveform shaping operation circuit 103 at the bit precision corresponding to the bit precision of the D/A converter 106 connected to the subsequent stage based on a quantization level interval control signal output from the quantization level adjustment circuit 105. At this time, the transfer function of the unequal-interval quantization circuit 104 is determined by the quantization level interval control signal from the quantization level adjustment circuit 105. This transfer function includes the difference from the preset initial transfer function. Here, the transfer function of the unequal-interval quantization circuit 104 is defined as a function expressing the relationship between the input value and the output value of the unequal-interval quantization circuit 104.

As the initial transfer function, for example, it is acceptable to set a transfer function in a case where the quantization is performed by the equally spaced quantization level interval as is the case with the first exemplary embodiment. Moreover, it is also acceptable to set a transfer function in a case where the quantization is performed by a sufficiently large quantization level and equally spaced interval as the initial transfer function. In this case, the initial transfer function is expressed as a linear transfer function. The difference from the initial transfer function means a difference between the output value by using the transfer function of the unequal-interval quantization circuit 104 and the output value by using the initial transfer function for the same input signal.

The quantization level adjustment circuit 105 outputs to the unequal-interval quantization circuit 104 a quantization level interval control signal which sets the quantization level interval based on the output signal from the waveform shaping operation circuit 103. In the present exemplary embodiment, the quantization level adjustment circuit 105 outputs the quantization level interval control signals so that they may be densely distributed in a part where the frequency distribution is large and they may be sparsely distributed in a part where the frequency distribution is small based on the amplitude frequency distribution of the output waveform of the waveform shaping operation circuit 103.

The unequal-interval quantization circuit 104 and the quantization level adjustment circuit 105 compose an exemplary embodiment of the unequal-interval quantization unit of the present invention.

The D/A converter 106 outputs, through the output level adjustment circuit 107, the analog signal corresponding to the value which the signal quantized by the unequal-interval quantization circuit 104 indicates.

The output level adjustment circuit 107 adjusts the output level of the D/A converter 106 according to the output level control signal output from the transfer function correction circuit 108. For example, the output level adjustment circuit 107 may adjust the output level of the D/A converter 106 by adjusting a value of a resistor in an R-2R ladder used in a conventional D/A converter or controlling an output current addition amount, and the like. In other words, the output level adjustment circuit 107 corrects the transfer function of the D/A converter 106.

The transfer function correction circuit 108 outputs, to the output level adjustment circuit 107, the output level control signal to correct the transfer function of the D/A converter 106. Specifically, the transfer function correction circuit 108 outputs the signal by which the output level is controlled at the unequal interval so as to compensate the difference between the transfer function of the unequal-interval quantization circuit 104 and the initial transfer function.

Here, the difference between the transfer function of the unequal-interval quantization circuit 104 and the initial transfer function depended on the unequally spaced quantization level interval which is set in the quantization level adjustment circuit 105. The transfer function correction circuit 108, accordingly, obtains the information about the transfer function of the unequal-interval quantization circuit 104 from the quantization level adjustment circuit 105. The transfer function correction circuit 108 generates the output level control signal based on the obtained information about the transfer function. At this time, the transfer function correction circuit 108 generates the output level control signal adjusting the output level so that the difference between the transfer function of the D/A converter 106 and the initial transfer function may become an almost inverse characteristic of the difference between the transfer function of the unequal-interval quantization circuit 104 and the initial transfer function.

The transfer function correction circuit 108 need not generate the output level control signal to compensate the difference for all points at which the difference between the transfer function of the unequal-interval quantization circuit 104 and the initial transfer function arises. For example, the transfer function correction circuit 108 may generate the output level control signal to compensate a maximum value, an average value, an integral value, and the like of the absolute value of the difference between the transfer function of the unequal-interval quantization circuit 104 and the initial transfer function.

The output level adjustment circuit 107 and the transfer function correction circuit 108 compose an exemplary embodiment of the output level adjustment unit in the present invention.

The output amplifier 109 amplifies the output signal of the D/A converter 106 and inputs it into the modulator 110.

The modulator 110 modulates the output signal from the output amplifier 109 and transmits it as the transmission signal.

The output amplifier 109 and the modulator 110 compose an exemplary embodiment of the modulation unit in the present invention.

The operation of the transmission device 10 configured above will be described.

First, the encoding circuit 102 performs the encoding process corresponding to a modulation method which is adopted by the transmission device 10 to the data input into the transmission device 10.

Next, the waveform shaping operation circuit 103 performs various waveform shaping processes to the encoded signal so that the transmission characteristic of the transmission device 10 may become suitable. For example, as mentioned above, the waveform shaping operation circuit 103 may perform a process to compensate in advance the waveform distortion arising in the transmission line. For example, a case will be described in which a signal output from the waveform shaping operation circuit 103 has waveforms as shown in FIG. 3A. Here, FIG. 3B shows an amplitude histogram f(x) of the waveforms shown in FIG. 3A.

Next, the quantization level adjustment circuit 105 outputs the quantization level interval control signal so that they may be densely distributed in a part where the value of the histogram f(x) is large and they may be sparsely distributed in a part where the value of the histogram f(x) is small. The quantization level interval control signal is a control signal to quantize the output signal from the waveform shaping operation circuit 103 by the unequally spaced quantization level interval as shown in FIG. 3C. In this example, the quantization level adjustment circuit 105 generates the quantization level interval control signal at the interval that is inversely proportional to the histogram f(x). Further, the quantization level adjustment circuit 105 supplies the transfer function correction circuit 108 with the transfer function information on the unequal-interval quantization circuit 104 that is determined by the quantization level interval control signal.

Next, the transfer function correction circuit 108 outputs to the output level adjustment circuit 107 the output level control signal adjusting the output level of the D/A converter 106 so as to compensate the difference between the transfer function of the unequal-interval quantization circuit 104 and the initial transfer function based on the transfer function information.

Next, the unequal-interval quantization circuit 104 quantizes the output signal from the waveform shaping operation circuit 103 based on the quantization level interval control signal from the quantization level adjustment circuit 105.

Next, the D/A converter 106 converts the digital signal quantized by the unequal-interval quantization circuit 104 into the analog signal and outputs it through the output level adjustment circuit 107. As a result, the D/A converter 106 has a transfer characteristic that has an almost inverse characteristic to the difference from the initial transfer function that arises in the unequal-interval quantization circuit 104. That is to say, by combining the unequal-interval quantization circuit 104 and the output level adjustment circuit 107, the initial transfer function, which generally has a linear transfer characteristic, can be obtained.

Next, an example of the operation of the unequal-interval quantization circuit 104 and the quantization level adjustment circuit 105 will be described in detail.

FIG. 4 shows an example of the output value of the unequal-interval quantization circuit 104 to the input value. In FIG. 4, it is assumed that an amplitude frequency distribution of the waveform indicated by values $a_{out}$ which are output from the waveform shaping operation circuit 103 and input into the unequal-interval quantization circuit 104 is approximately Gaussian distribution. It is also assumed that this Gaussian distribution is characterized by a dispersion $\sigma^2$ indicating the width of Gaussian distribution. In FIG. 4, the horizontal axis represents the output value $a_{out}$ of the waveform shaping operation circuit 103, and the vertical axis represents the output value $b_{out}$ of the unequal-interval quantization circuit 104. It is assumed that a bit width m of the output value $b_{out}$ is equal to 4 bits corresponding to the input bit precision of the D/A converter 106.

In FIG. 4, the unequal-interval quantization circuit 104 quantizes $a_{out}$ into $b_{out}$ by the unequally spaced quantization level interval so that $b_{out}$ may become a code $b_k$, which is a binary number with 4-bits in the example shown in FIG. 3, when $a_{out}$ is greater than or equal to $a_k$ and less than $a_{k+1}$. Here, the values of $a_0$ to $a_{2^m-1}$ represent threshold values of the quantization level interval when $a_{out}$ having a bit width 1 is quantized into $2^m$ steps. Hereinafter, quantizing $a_{out}$ into $b_{out}$ will be also represented as quantization mapping.

In FIG. 4, a curve line (i) represents a curve line proportional to values expressed in the following formula (1). A straight line (ii) represents the initial transfer function. Here, it is assumed that a linear transfer function in a case where the quantization is performed by a sufficiently large and equally spaced quantization level interval is set for the initial transfer function.

$$h(a_{out}) = \int_{-FS/2}^{a_{out}} f(x)dx = \int_{-FS/2}^{a_{out}} \frac{1}{\sqrt{2\pi}\,\sigma} \exp\left(-\frac{(x - FS/2)^2}{2\sigma^2}\right)dx \quad (1)$$

In formula (1), f (x) represents a Gaussian distribution shape in which the output signal value $a_{out}$ is expressed as x, σ represents the dispersion of the Gaussian distribution, and FS (full-scale) represents a value expressing the maximum output value from the waveform shaping operation circuit 103.

At this time, it is also acceptable for the quantization level adjustment circuit 105 to determine the output value $a_k$ (k=0 to $a_{2^m-1}$) based on a predetermined set value expressing a waveform status of the output signal from the waveform shaping operation circuit 103. The predetermined set value may be the dispersion $\sigma^2$, for example. It is also acceptable for the dispersion $\sigma^2$ to be determined corresponding one-to-one with a set value concerning a waveform shaping process of the waveform shaping operation circuit 103. The quantization level adjustment circuit 105 supplies the determined output value $a_k$ to the unequal-interval quantization circuit 104 as the quantization level interval control signal. The quantization level adjustment circuit 105 generates the information about the transfer function of the unequal-interval quantization circuit 104 and supplies it to the transfer function correction circuit 108.

It is possible for the quantization level adjustment circuit 105 to determine a value as $a_k$ so that a value $h(a_k)$ for $a_k$ on the curve line (i) may become an arbitrary value between $b_{k-1}$ and $b_k$. In order to determine the value $a_k$, it is also possible for the quantization level adjustment circuit 105 to determine a value of $a_k$ by performing a calibration, a training, a feedback control, and the like so that the eye opening of the output waveform of the transmission device 10 or the bit error rate (BER) may become more suitable.

The waveform (1) shown in FIG. 4 represents a sine wave as an example of a waveform which is output from the waveform shaping operation circuit 103 and input into the unequal-interval quantization circuit 104. The waveform (2) represents a waveform having traced output values which are obtained by quantization mapping of the input values expressed by the waveform (1) by the quantization level interval $a_k$ defined as shown in FIG. 4. Thus, it is understood that the input waveform (1) having the value in an area where the quantization level intervals $a_k$ are densely set is output as the waveform (2) which is densely quantized.

Next, an example of the operation of the D/A converter 106, the level adjustment circuit 107, and the transfer function correction circuit 108 will be described in detail using FIG. 5.

FIG. 5 is a figure to explain analog output amplitudes $c_{out}$ of the D/A converter 106 when the output value $b_{out}$ from the unequal-interval quantization circuit 104 shown in FIG. 4 is input into the D/A converter 106. In FIG. 5, the horizontal axis represents the output value $b_{out}$ of the unequal-interval quantization circuit 104, and the vertical axis represents the analog output amplitude $c_{out}$ of the D/A converter 106. In FIG. 5A, the curve line (iii) has an inverse function relationship with the curve line (i) shown in FIG. 4. The D/A converter 106 converts the output value $b_{out}$ of the unequal-interval quantization circuit 104 into the analog signal and outputs the analog signal with the amplitude $c_{out}$ through the level adjustment circuit 107.

At this time, by the adjustment in the level adjustment circuit 107, the amplitude $c_{out}$ is determined corresponding one-to-one with $b_{out}$ on the basis of the curve line (iii). Here, since there is an inverse function relationship between the curve line (i) and the curve line (iii), it is understood that by the combination of the unequal-interval quantization circuit 104 and the D/A converter 106, a nearly-ideal transfer characteristic, which is a linear characteristic in general, can be obtained in which the difference from the initial transfer function is compensated.

The waveform (2) shown in FIG. 5 represents a waveform tracing the output values from the unequal-interval quantization circuit 104 which is input into the D/A converter 106. Here, the same waveform as the waveform (2) shown in FIG. 4 is expressed as the waveform (2). The analog signal (3) represents a waveform of the analog signal converted from the waveform (2) by means of the D/A converter 106 whose output level is adjusted. Thus, it is understood that the signal of the waveform (1) output from the waveform shaping operation circuit 103 is converted into the analog signal (3) at high resolution with keeping linearity by being converted once into the signal with the waveform (2) which is densely quantized by the unequal-interval quantization circuit 104.

Next, the reason why the effective resolution is improved by the transmission device 10 of the present invention will be described in detail using FIG. 6 and FIG. 7.

Figure 6A:
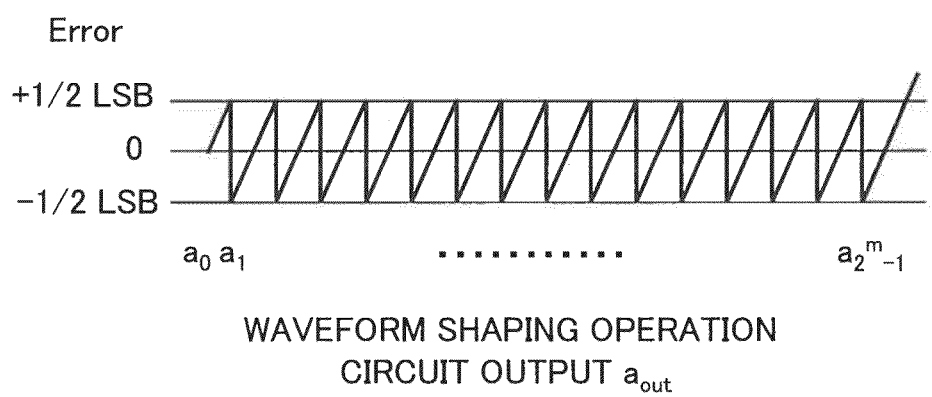
FIG. 6A is a figure to explain a quantization error due to equal-interval quantization.
Figure 6B:
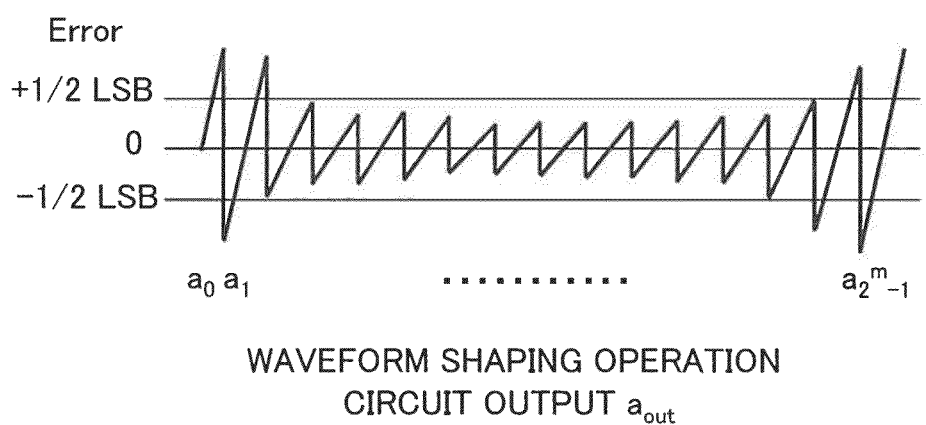
FIG. 6B is a figure to explain a quantization error of an unequal-interval quantization circuit according to the second exemplary embodiment of the present invention.

FIG. 6A and FIG. 6B are figures showing quantization errors in quantizing the input value $a_{out}$. For comparison, FIG. 6A shows the quantization errors in a case of quantizing $a_{out}$ by the equally spaced interval, and FIG. 6B shows the quantization errors in a case of quantizing $a_{out}$ by the unequally spaced interval in the unequal-interval quantization circuit 104 according to the present exemplary embodiment. FIG. 6B shows the quantization errors in the case where a value corresponding to a value right in the intermediate between $b_{k-1}$ and $b_k$ is defined as $a_k$ on the curve line (i) shown in FIG. 4 when the bit width 1 of the input value $a_{out}$ is sufficiently large.

Here, it is understood that there arise uniform quantization errors between $-\frac{1}{2}$ LSB (least significant bit=$\frac{1}{2}^m$) and $+\frac{1}{2}$ LSB in FIG. 6A regardless of the magnitude of the input value $a_{out}$. On the other hand, it is understood that in FIG. 6B, the quantization errors are small for the input values near the center and become larger for the input values near the edges. Accordingly, when input values whose amplitude frequency distribution shows a waveform having an approximate Gaussian distribution as shown in FIG. 3 are input into the unequal-interval quantization circuit 104 generating the quantization errors as shown in FIG. 6B, the quantization with a small quantization error is performed for highly-frequent input values near the center, and the quantization with a large quantization error is performed for low-frequent input values near the edges. Accordingly, it is understood that the unequal-interval quantization circuit 104 according to the present exemplary embodiment is able to reduce the substantive quantization noise compared with a case where the D/A conversion process is performed by quantizing with equally spaced interval as shown in FIG. 6A.

Figure 7A:
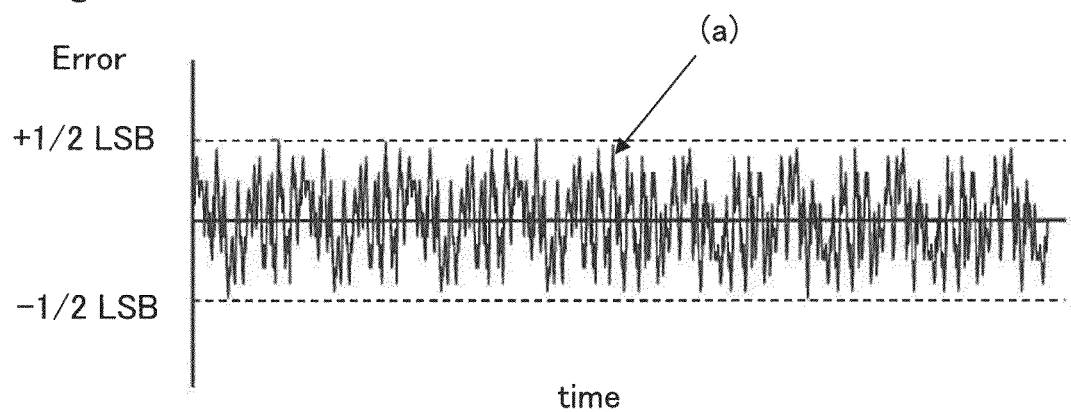
FIG. 7A is a figure to explain a quantization error arising with time in a D/A conversion process with an equal-interval quantization.
Figure 7B:
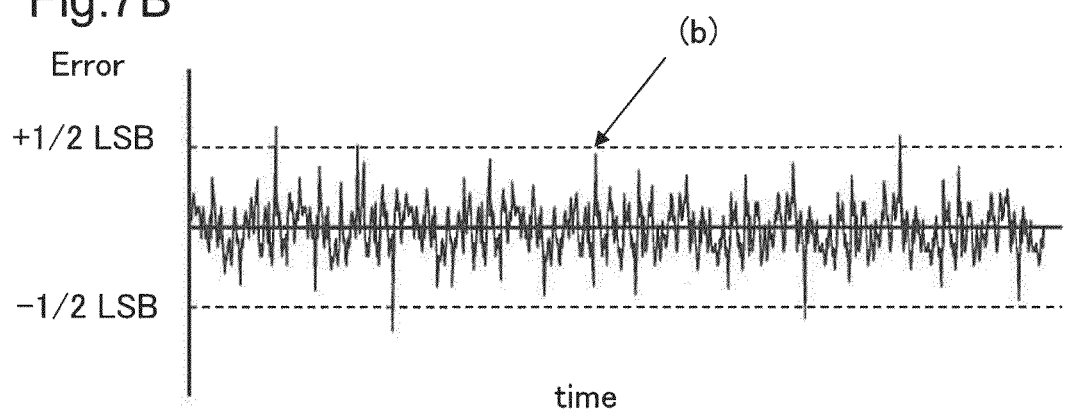
FIG. 7B is a figure to explain a quantization error arising with time in a D/A conversion process using an unequal-interval quantization circuit according to the second exemplary embodiment of the present invention.
Figure 7C:
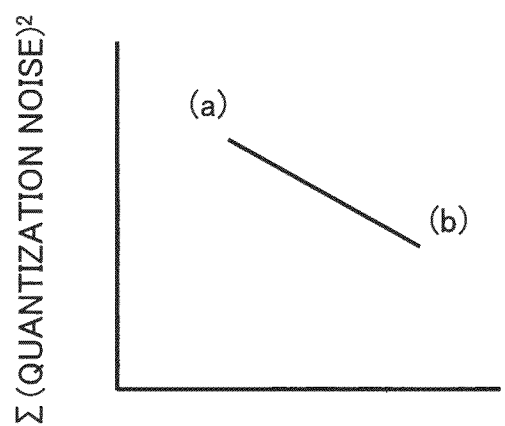
FIG. 7C is a figure to explain reduction in quantization noise by a D/A conversion process in the second exemplary embodiment of the present invention.

Next, by using FIGS. 7A, 7B, and 7C, the way will be described more specifically that the quantization noise becomes smaller by the unequal-interval quantization circuit 104 according to the present exemplary embodiment. FIGS. 7A, 7B, and 7C show images of the quantization error arising with time. In FIGS. 7A, 7B, and 7C, it is assumed that the input values $a_{out}$ are input into the unequal-interval quantization circuit 104 which shows the waveform whose amplitude frequency distribution is high near the center and is low near the edges.

FIG. 7A is a figure showing an image of the quantization error arising with time when the output level mapping with an equal-interval as shown in FIG. 6A is performed by using the related D/A conversion. In FIG. 7A, it is understood that the uniform quantization noise arises between −½ LSB and +½ LSB with time.

On the other hand, FIG. 7B is a figure showing an image of the quantization error arising with time when the output level mapping is performed by the unequal-interval quantization circuit 104 and the D/A converter 106 according to the present exemplary embodiment as shown in FIG. 6B. It is understood that in the case shown in FIG. 7B compared with that shown in FIG. 7A, the frequency of occurrence of quantization error smaller than ±½ LSB is high and the frequency of occurrence of quantization error larger than ±½ LSB is low. Therefore, it is understood that the transmission device 10 according to the present exemplary embodiment improves an average power (for example, a square sum mean) of the quantization error as shown in FIG. 7C.

Although the explanation has been performed by using equation (1) in the present exemplary embodiment under the condition that the amplitude histogram of the input waveform of the unequal-interval quantization circuit 104 has a Gaussian distribution, the input signal into the unequal-interval quantization circuit 104 is not limited to a signal with a waveform whose amplitude frequency distribution is Gaussian distribution. The transmission device 10 according to the present exemplary embodiment does not necessarily perform the unequal-interval quantization mapping and the output level adjustment (inverse mapping) based on equation (1). For example, it is acceptable for the quantization level adjustment circuit 105 according to the present exemplary embodiment to set the quantization level interval inversely proportional to an absolute value $g(x)=|df(x)/dx|$ of the gradient of the amplitude frequency distribution $f(x)$.

It is also acceptable for the quantization level adjustment circuit 105 according to the present exemplary embodiment to set the quantization level interval more densely for an area in which the waveform sharply changes and more sparsely for an area in which the waveform gradually changes so as to perform the D/A conversion more precisely for the part where the signal changes fast in order to perform a digital signal processing for abrupt signal changes.

Next, the effects of the second exemplary embodiment of the present invention will be described.

The transmission device according to the second exemplary embodiment of the present invention enable the advanced waveform shaping process at the transmission side by preventing deterioration in transmission characteristic which is caused by insufficient resolution of the D/A converter in a high speed and large capacity digital communication.

The reason is because the unequal-interval quantization circuit performs the quantization by more dense quantization level interval to a part where the regeneration with high accuracy at the reception side is required depending on the output waveform from the waveform shaping operation circuit, the D/A converter converts the digital signal quantized by the unequally spaced interval into the analog signal, when the output level adjustment circuit adjusts the output level of the D/A converter so as to compensate the difference between the transfer function of the unequal-interval quantization circuit and the initial transfer function. By this, it is possible for the transmission device according to the second exemplary embodiment of the present invention to improve the effective resolution of the D/A converter to a part where the regeneration with high accuracy at the reception side keeping a high linearity in the D/A conversion. As a result, it is possible for the transmission device according to the second exemplary embodiment of the present invention to prevent deterioration in transmission accuracy of the transmission device even though the physical resolution of the D/A converter is insufficient which is required for the waveform shaping process such as a chromatic dispersion pre-compensation process, an OFDM modulation process, a multi-level modulation process, or the like.

Next, another aspect of the second exemplary embodiment of the present invention will be described.

FIG. 8 is a block diagram showing a configuration of a transmission device 70 according to another aspect of the second exemplary embodiment of the present invention. Here, in FIG. 8, the transmission device 70 includes a waveform monitor 701 in addition to the same configurations as those of the transmission device 10 shown in FIG. 2. The waveform monitor 701 composes one exemplary embodiment of the monitor unit of the present invention.

The waveform monitor 701 monitors the output waveform from the waveform shaping operation circuit 103 and supplies the waveform information to the quantization level adjustment circuit 105. It becomes possible for the transmission device 70 having such configuration to obtain the waveform information shown by the input value of the unequal-interval quantization circuit 104 without depending on the set value of the waveform shaping operation circuit 103. Accordingly, it becomes possible for the transmission device 70 configured like that to control the quantization level adjustment circuit 105 adaptively and more easily even though the set value of the waveform shaping operation circuit 103 has changed in order to set the signal transmission characteristic suitably.

It is acceptable that the waveform monitor 701 is configured to include the function of the quantization level adjustment circuit 105. In this case, the waveform monitor 701 may supply the quantization level interval control signal to the unequal-interval quantization circuit 104 and supply the transfer function information to the transfer function correction circuit 108 as shown by a dashed line in FIG. 8.

The unequal-interval quantization process and the transfer function correction process to correct the difference from the initial transfer function due to the unequal-interval quantization mapping in the second exemplary embodiment of the present invention are not limited to the processes shown in FIG. 3 and FIG. 4. In the second exemplary embodiment of the present invention, it is only necessary for the unequal-interval quantization process to quantize densely a part showing the waveform which is required to be reproduced with high accuracy at the reception side.

The transfer function correction process in the present exemplary embodiment does not necessarily compensate the difference from the initial transfer function by the unequal-interval quantization completely. For example, it is acceptable for the transfer function correction process in the present exemplary embodiment to be processes in which the unequal-interval quantization process to compensate completely the difference and the transfer function correction process as shown in FIG. 3 and FIG. 4 are slightly adjusted so that the transmission quality and the error rate at the receiving end may become suitable based on band characteristics of a transmission line, a dispersion, and the like.

In the second exemplary embodiment of the present invention, it is also acceptable for the output level adjustment unit of the present invention to be composed of the output amplifier 109 instead of the output level adjustment circuit 107. In this case, the output level adjustment unit of the present invention is realized by using a logarithmic amplifier or an anti-logarithmic amplifier as the output amplifier 109, for example and adjusting its gain characteristics.

The Third Exemplary Embodiment

Next, the third exemplary embodiment of the present invention will be described in detail with reference to drawings. In the present exemplary embodiment, an example will be described in which a transmission device transmitting data through an optical fiber transmission line is applied to the transmission device of the present invention. In each drawing referred to in the explanation of the present exemplary embodiment, the identical reference numbers are used for the same configurations as those in the first and second exemplary embodiments of the present invention and the detailed description of the configuration will be omitted.

Figure 9:
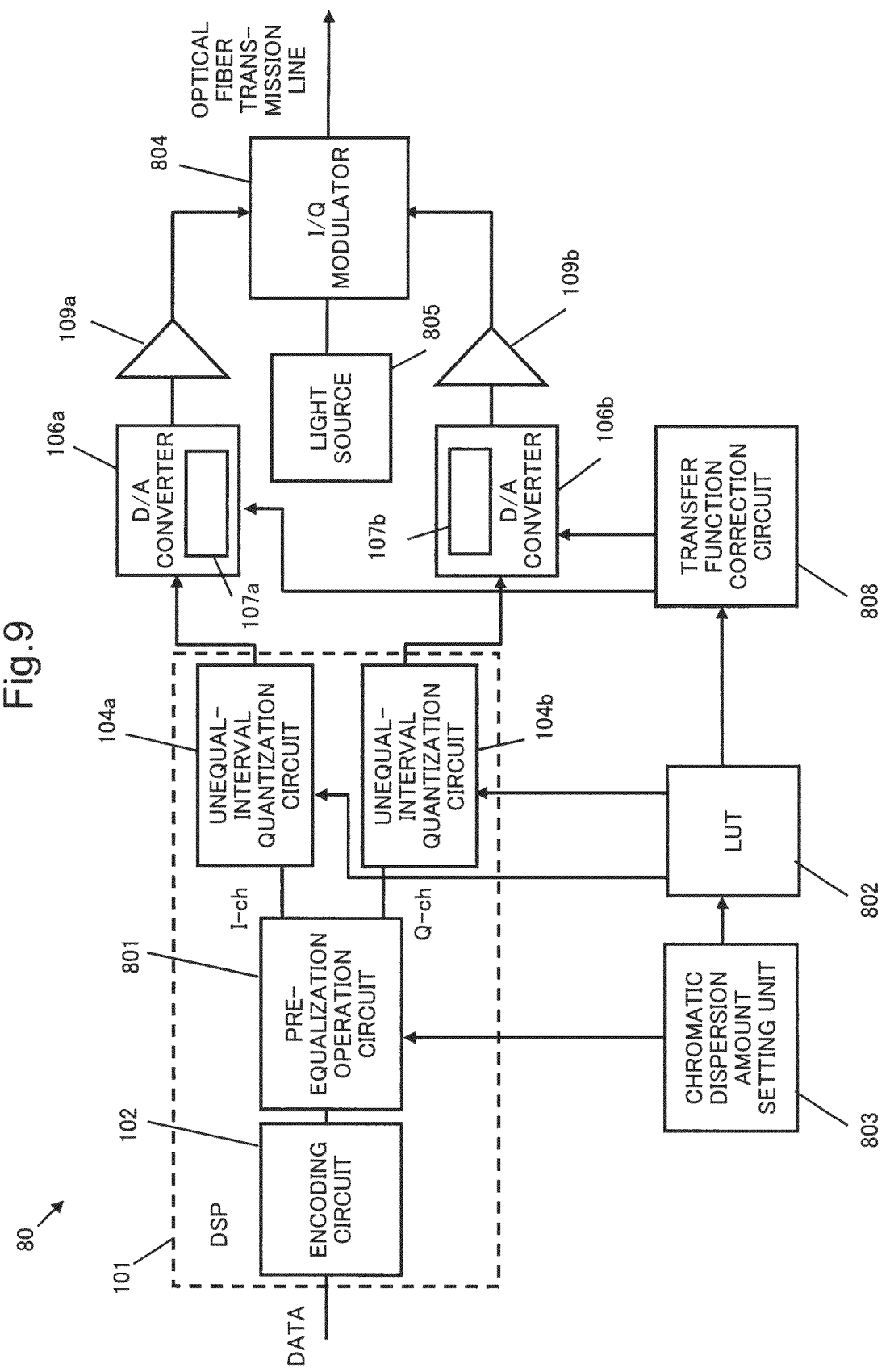
FIG. 9 is a functional block diagram of a transmission device according to the third exemplary embodiment of the present invention.

First, a schematic configuration of a transmission device 80 according to the third exemplary embodiment of the present invention is shown in FIG. 9. In FIG. 9, the transmission device 80 includes a pre-equalization operation circuit 801 instead of the waveform shaping operation circuit 103 and an LUT (lookup-table) 802 instead of the quantization level adjustment circuit 105 compared with the transmission device 10 according to the second exemplary embodiment of the present invention. Further, the transmission device 80 differs from the transmission device 10 in that it includes a transfer function correction circuit 808 instead of the transfer function correction circuit 108, an I/Q modulator 804 instead of the modulator 110, and it further includes a chromatic dispersion amount setting circuit 803 and a signal light source 805.

The transmission device 80 includes unequal-interval quantization circuits 104a and 104b instead of the unequal-interval quantization circuit 104 and D/A converters 106a and the 106b instead of the D/A converter 106. Further, the transmission device 80 also differs from the transmission device 10 according to the second exemplary embodiment of the present invention in that it includes output level adjustment units 107a and 107b instead of the output level adjustment unit 107.

The chromatic dispersion amount setting circuit 803 stores a chromatic dispersion amount of the optical fiber transmission line in advance.

The pre-equalization operation circuit 801 performs the pre-equalization operation in advance to cancel (pre-equalize or compensate) the waveform distortion due to the chromatic dispersion applied in the optical fiber transmission line based on the chromatic dispersion amount set in the chromatic dispersion amount setting circuit 803.

For example, it is possible for an approximate transfer function of the optical fiber transmission line ignoring a higher order dispersion to be modeled by $\exp(j\beta_2\omega^2 L/2)$ (j represents imaginary unit, ($\beta_2$: group velocity dispersion parameter, $\omega$: signal light angular frequency, and L: transmission distance). Accordingly, the pre-equalization operation circuit 801 performs the pre-equalization operation process that input data are multiplied by $\exp(-j\beta_2\omega^2 L/2)$ having inverse characteristics to the transfer characteristics of the optical fiber transmission line. By this process, the pre-equalization operation circuit 801 compensates in advance the waveform distortion arising in the optical fiber transmission line.

After the signal for which the pre-equalization operation process is performed is transmitted through the optical fiber transmission line, it is received having turned a suitable signal without the waveform distortion at the receiving end. As can be seen from the fact that the transfer function of the above-mentioned optical fiber transmission line includes the complex operation, the pre-equalization operation circuit 801 outputs two signals of I-ch (In-phase channel) and Q-ch (Quadrature channel).

Each of the unequal-interval quantization circuits 104a and 104b is similar in configuration to the unequal-interval quantization circuit 104 according to the second exemplary embodiment of the present invention. Each of the unequal-interval quantization circuits 104a and 104b, however, differs from the unequal-interval quantization circuit 104 according to the second exemplary embodiment of the present invention in that it outputs values obtained by quantizing the input value by the unequally spaced interval referring to the LUT 802 instead of basing on the quantization level interval control signal from the quantization level adjustment circuit 105. Each of the unequal-interval quantization circuits 104a and 104b performs the quantization by the unequally spaced interval for the signal of I-ch and the signal of Q-ch output from the pre-equalization operation circuit 801 based on the LUT 802.

Each of the D/A converters 106a and 106b is similar in configuration to the D/A converter 106 according to the second exemplary embodiment of the present invention. That is to say, the D/A converters 106a and 106b convert the digital signals output from the unequal-interval quantization circuits 104a and 104b into the analog signals, respectively.

Each of the output level adjustment units 107a and 107b is similar in configuration to the output level adjustment unit 107 according to the second exemplary embodiment of the present invention. That is to say, the output level adjustment units 107a and 107b adjust the output levels of the D/A converters 106a and 106b based on the output level control signal from the transfer function correction circuit 808, respectively.

The LUT 802 stores the input value and the output value of the unequal-interval quantization circuit 104 with interrelating them in advance. Here, the correspondence relationship between the input value and the output value stored in the LUT 802 is interrelated in advance so that the quantization by the unequally spaced quantization level interval based on the output waveform from the pre-equalization operation circuit 801 may be realized.

Here, the operation performed in the pre-equalization operation circuit 801 is determined by the chromatic dispersion amount of the optical fiber transmission line set in the chromatic dispersion amount setting circuit 803. At this time, if the chromatic dispersion amount of the optical fiber transmission line is determined, for example, if the above-mentioned $\beta_2$, $\omega$, and L are determined, the operation in the pre-equalization operation circuit 801 is uniquely determined and the output waveform from the pre-equalization operation circuit 801 is also determined. Accordingly, it is possible for the LUT 802 to store the quantization mapping table for the input value and the output value corresponding to the set value in the chromatic dispersion amount setting circuit 803.

Figure 10:
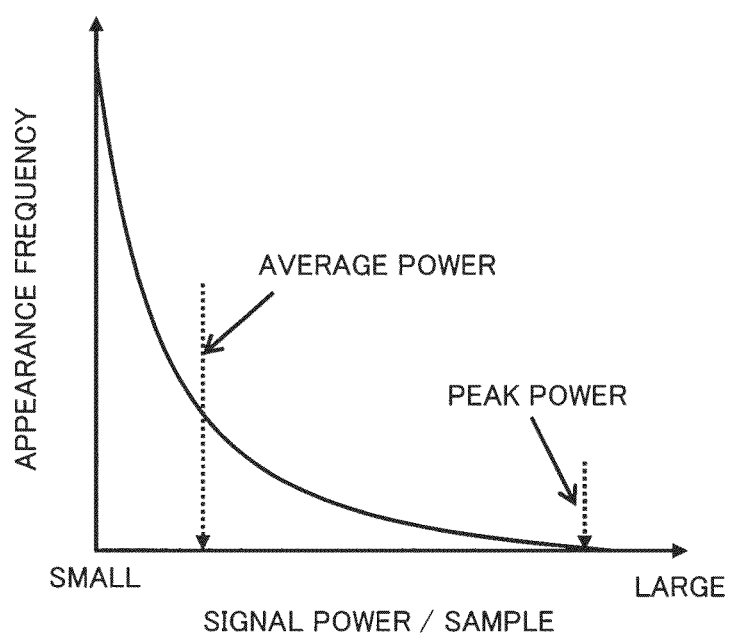
FIG. 10 is a figure showing an appearance frequency distribution of a power of a signal waveform output from a pre-equalization operation circuit according to the third exemplary embodiment of the present invention.

Here, FIG. 10 shows an image of an appearance frequency of a power, which is proportional to the square of amplitude, per sampling point of the digital signal for which the pre-equalization operation is performed by the pre-equalization operation circuit 801. As shown in FIG. 10, the waveform shown by the digital signal from the pre-equalization operation circuit 801 generally has a very large PAPR (peak-to-average power ratio) which represents a ratio of a signal peak power to an average power in comparison with a case without performing the pre-equalization operation. It is acceptable, therefore, for the LUT 802 to store the quantization mapping table which is determined based on the amplitude frequency distribution of the waveform shown by the digital signal from the pre-equalization operation circuit 801.

The transfer function correction circuit 808 is similar in configuration to the transfer function correction circuit 108 according to the second exemplary embodiment of the present invention. The transfer function correction circuit 808, however, differs from the transfer function correction circuit 108 in that it obtains the transfer function information on the unequal-interval quantization circuits 104a and 104b by referring to the LUT 802 instead of obtaining the transfer function information from the quantization level adjustment circuit 105. The transfer function correction circuit 808 outputs to the output level adjustment units 107a and 107b the output level adjustment signals which adjust the output levels of the D/A converters 106a and 106b so that the difference between the transfer function of the unequal-interval quantization circuits 104a, 104b and the initial transfer function may be compensated.

The output amplifiers 109a and 109b amplify the output signals from the D/A converters 106a and 106b, respectively. The I/Q modulator 804 I/Q modulates the output light from the signal light source 805 by the output signals from the output amplifiers 109a and 109b.

The operation of the transmission device 80 configured above will be described.

First, the encoding circuit 102 encodes the data input into the DSP 101 according to the modulation method used in the transmission device 80. Next, the pre-equalization operation circuit 801 performs the pre-equalization operation for the encoded signal to cancel the waveform distortion due to the chromatic dispersion applied in the optical fiber transmission line. For example, the pre-equalization operation circuit 801 performs the pre-equalization operation process in which the input data is multiplied by exp $(-j\beta_2\omega^2L/2)$ that has inverse characteristics to the transfer characteristic of the optical fiber transmission line as described above. The pre-equalization operation circuit 801 outputs two signals of I-ch and Q-ch.

Next, the unequal-interval quantization circuits 104a and 104b quantize two signals of I-ch and Q-ch by the unequally spaced interval by means of performing a quantization mapping referring to the LUT 802.

Figure 11:
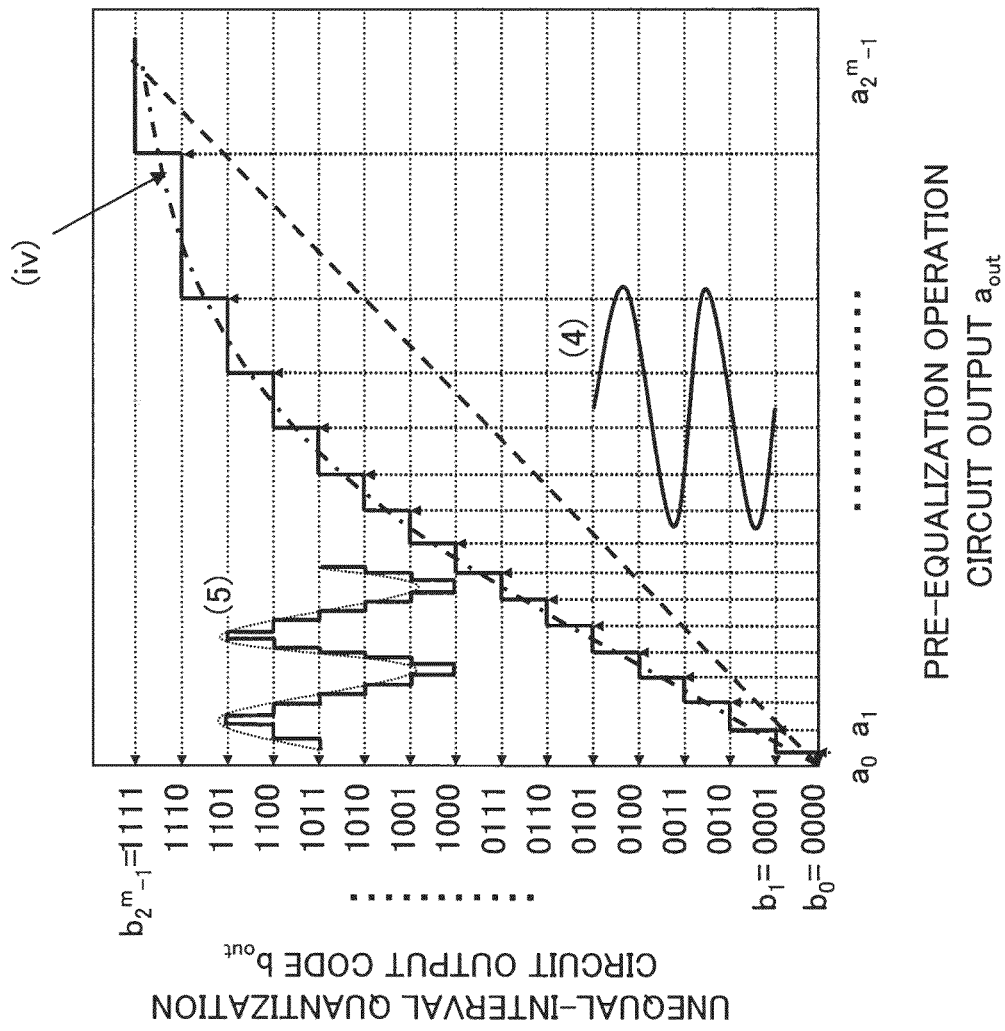
FIG. 11 is a figure to explain a transfer function of an unequal-interval quantization circuit according to the third exemplary embodiment of the present invention.

Here, an example of the unequal-interval quantization process performed by the unequal-interval quantization circuits 104a and 104b is shown in FIG. 11. In FIG. 11, a curve line (iv) represents the transfer characteristic determined based on the frequency distribution shown in FIG. 10. The unequal-interval quantization circuits 104a and 104b perform the quantization densely where the amplitude of the output waveform from the pre-equalization operation circuit 801 is small and sparsely where it is large. Thus, the unequal-interval quantization circuits 104a and 104b perform the quantization by unequal-interval based on the frequency distribution of the amplitude of the waveform which is shown by the output value $a_{out}$ from the pre-equalization operation circuit 801, and outputs $b_{out}$.

Next, the D/A converters 106a and 106b convert the digital signals from the unequal-interval quantization circuits 104a and 104b into the analog signals. The transfer function correction circuit 808 obtains the transfer function information on the unequal-interval quantization circuits 104a and 104b based on the LUT 802. The transfer function correction circuit 808 outputs to the output level adjustment circuits 107a and 107b the output level adjustment signals by which the output levels of the D/A converters 106a and 106b are adjusted so as to compensate the differences between the transfer function information on the unequal-interval quantization circuits 104a and 104b and the initial transfer function, respectively. The D/A converters 106a and 106b output the analog signals whose output levels are adjusted by the output level adjustment circuits 107a and 107b, respectively.

Figure 12:
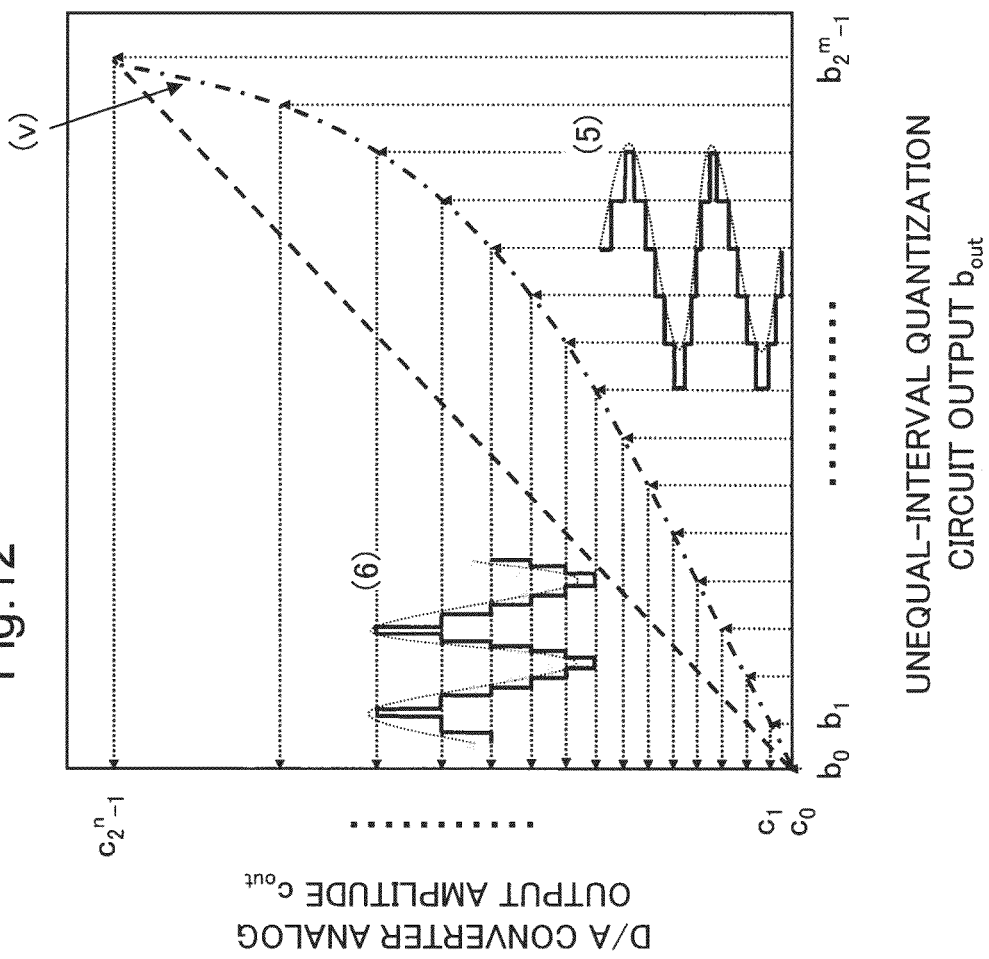
FIG. 12 is a figure to explain a transfer function of a D/A converter whose output level is adjusted by an output level adjustment unit according to the third exemplary embodiment of the present invention.

Here, FIG. 12 shows the transfer function of the D/A converters 106a and 106b whose output levels are adjusted by the output level adjustment circuits 107a and 107b. In FIG. 12, a curve line (v) has the relationship of an inverse function to the curve line (iv) shown in FIG. 11. Thus, the D/A converters 106a and 106b output analog signals with the amplitudes $c_{out}$ which are determined by the curve line (v) in one-to-one relationship with $b_{out}$.

Since the curve line (v) has an inverse function relationship with the curve line (iv), it is understood that the initial transfer function can be obtained by combining the unequal-interval quantization circuits 104a, 104b with the D/A converters 106a, 106b. That is to say, two output signals from the pre-equalization operation circuit 801 are converted into the analog signals based on the ideal initial transfer function by a combination between the unequal-interval quantization circuits 104a, 104b and the D/A converters 106a, 106b. Furthermore, at the time, two output signals from the pre-equalization operation circuit 801 are quantized more densely where the amplitude of the waveform shown by the value is smaller, and converted into the analog signals.

Next, the output amplifiers 109a and 109b amplify the output signals from the D/A converters 106a and 106b whose output levels are adjusted, respectively. The I/Q modulator 804 I/Q modulates the output light from the signal light source 805 by each amplified signal, and transmits it to the optical transmission line.

The waveform (4) shown in FIG. 11 represents a sine wave as an example of the output waveform of each signal from the pre-equalization operation circuit 801. The waveform (5) represents a waveform shown by the output values which are obtained by quantization mapping of the input values expressing the waveform (4) by the quantization level interval $a_k$ defined as shown in FIG. 11. Thus, it is understood that the waveform (4) having values in the area where the quantization level intervals $a_k$ are densely set is turned into the waveform (5) which is quantized densely, and is output.

The waveform (5) shown in FIG. 11 represents each output waveform from the unequal-interval quantization circuits 104a and 104b which is input into the D/A converter 106a or the D/A converter 106b. Here, as waveform (5), the same waveform as the waveform (5) shown in FIG. 10 is represented. Analog signal (6) represents a waveform of the analog signal which is converted from the waveform (5) by the D/A converter 106a or the D/A converter 106b whose output level is adjusted.

Thus, it is understood that the signal with the waveform (4) output from the pre-equalization operation circuit 801 is converted into the analog signal (6) at high resolution keeping linearity by being converted once into a signal with the waveform (5) which is densely quantized by the unequal-interval quantization circuits 104a and 104b.

This is the end of the explanation for the operation of the transmission device 80.

A piece of the information stored in the LUT 802 is not necessarily a table value for realizing the quantization mapping as shown in FIG. 11 and FIG. 12. It is acceptable for a piece of the information stored in the LUT 802 to be a table value for realizing the quantization mapping which is slightly adjusted from the quantization mapping shown in FIG. 11 and FIG. 12 so that the signal quality such as the error rate at the receiving end may become suitable.

It is possible that the curve line (iv) expressing the transfer characteristic shown in FIG. 11 is set independently for each signal of I-ch and Q-ch. In this case, it is acceptable for the LUT 802 and the transmission function correction circuit 808 to be provided independently for each signal of I-ch and Q-ch.

It is also acceptable for the transmission device 80 according to the third exemplary embodiment of the present invention to include the waveform monitor according to another aspect of the second exemplary embodiment of the present invention instead of the LUT 802. In this case, the waveform monitor may be provided independently with respect to each signal of I-ch and Q-ch. In this case, it is only necessary for the unequal-interval quantization circuits 104a and 104b to perform the unequal-interval quantization based on each output waveform state of I-ch and Q-ch from the pre-equalization operation circuit 801 which are obtained by the waveform monitors.

Next, the effects of the third exemplary embodiment of the present invention will be described.

The transmission device according to the third exemplary embodiment of the present invention is able to further improve the effect of the pre-equalization process that the chromatic dispersion in the optical transmission line is compensated in advance at the transmission side by preventing deterioration in transmission characteristic which is caused by insufficient resolution of the D/A converter in the digital optical communication.

The reason is because the unequal-interval quantization unit quantizes by unequal-interval each signal of I-ch and Q-ch output from the pre-equalization operation circuit based on the signal value, and then, the digital-to-analog conversion unit converts it into the analog signal. By this, it is possible for the transmission device according to the third exemplary embodiment of the present invention to improve the effective resolution in the area where the quantization is performed by more densely quantization level interval in comparison with a case where each signal of I-ch and Q-ch is directly input into the digital-to-analog conversion unit. And it is because the output level adjustment unit can maintain the conversion characteristic nearly equal to the ideal initial transfer function by means of adjusting the output level of each signal of I-ch and Q-ch from the digital-to-analog conversion unit so that the difference from the ideal initial transfer function which is generated by the unequal-interval quantization in the unequal-interval quantization unit may be compensated.

As a result, the transmission device according to the third exemplary embodiment of the present invention can improve the effect of the pre-equalization process by improving the effective resolution of the D/A converter even though the physical resolution of the D/A converter is insufficient which is required for the pre-equalization process in which the process is performed in advance at the transmission side for compensating the waveform distortion due to the chromatic dispersion in the optical transmission line.

The Fourth Exemplary Embodiment

Next, the fourth exemplary embodiment of the present invention will be described in detail with reference to the drawings. In the present exemplary embodiment, an example will be described in which the transmission device of the present invention is applied to a transmission device which adopts an OFDM modulation and performs data communication through an optical fiber transmission line. In each drawing referred to in the explanation of the present exemplary embodiment, the same reference numbers are used for the same configurations as those in the first to third exemplary embodiments of the present invention and their detailed description will be omitted in the present exemplary embodiment.

Figure 13:
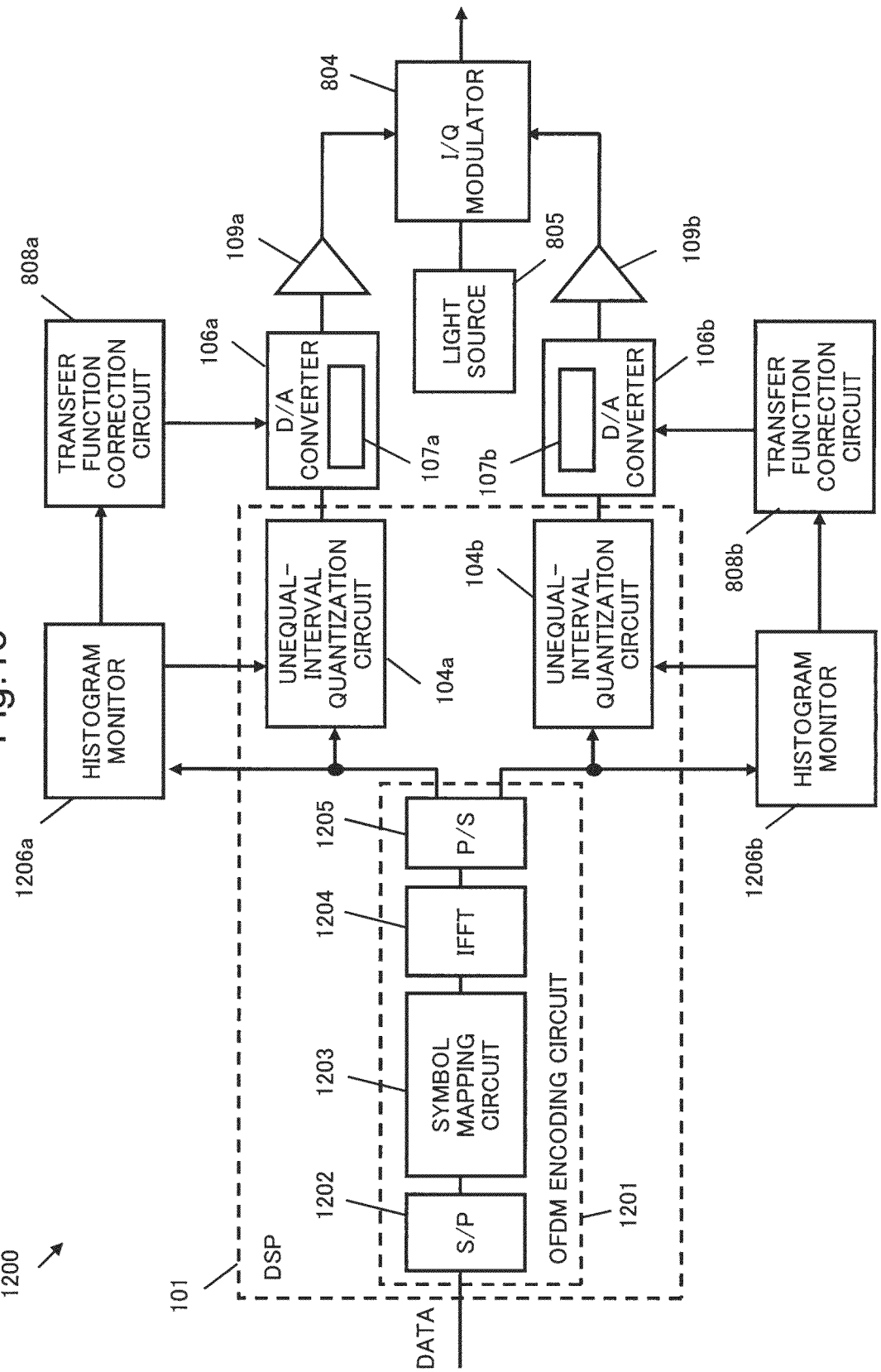
FIG. 13 is a functional block diagram of a transmission device according to the fourth exemplary embodiment of the present invention.
Figure 14:
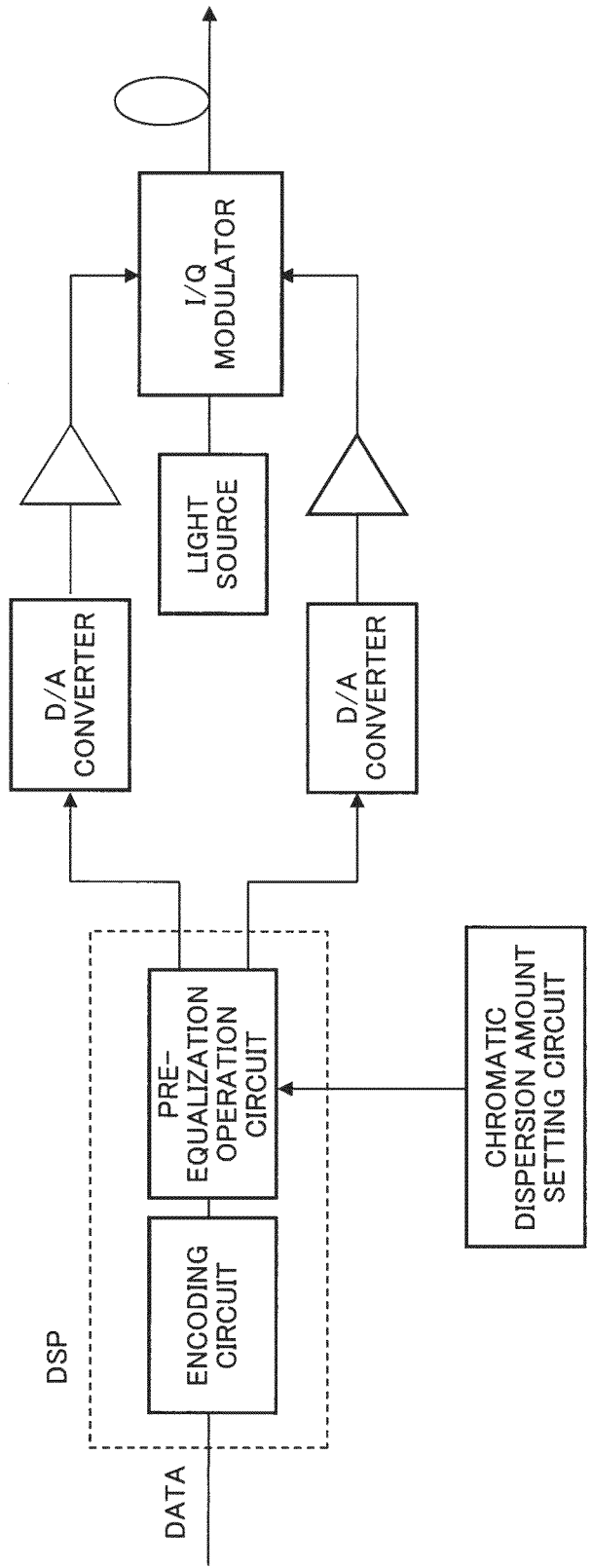
FIG. 14 is a figure showing a schematic configuration of a transmission device of a related technology.
Figure 15A:
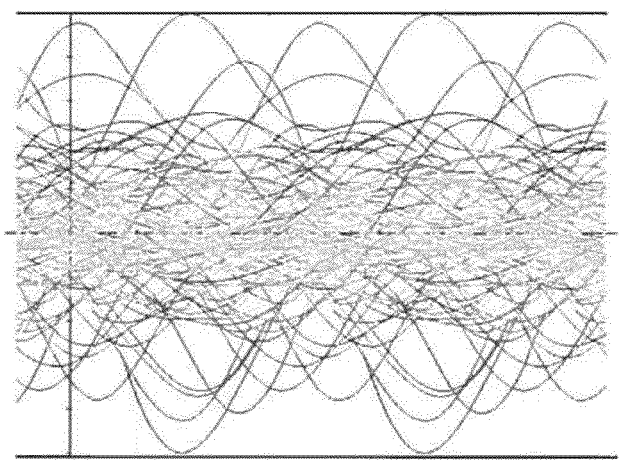
FIG. 15A is a figure showing a transmission waveform whose waveform is shaped by a transmission device of a related technology.
Figure 15B:
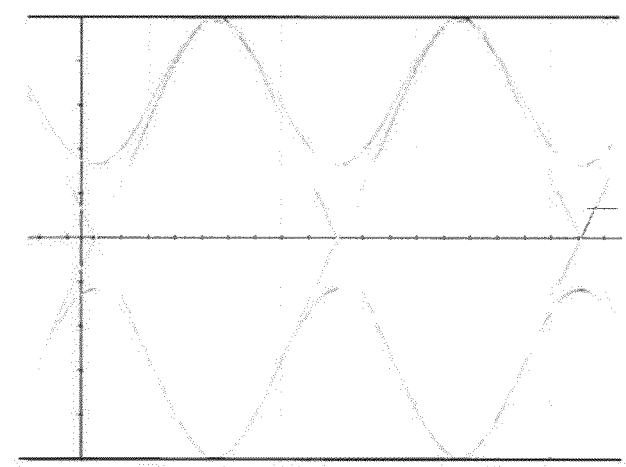
FIG. 15B is a figure showing a reception waveform of a signal input into a reception device after transmitting a signal with the transmission waveform shown in FIG. 15A.
Figure 16:
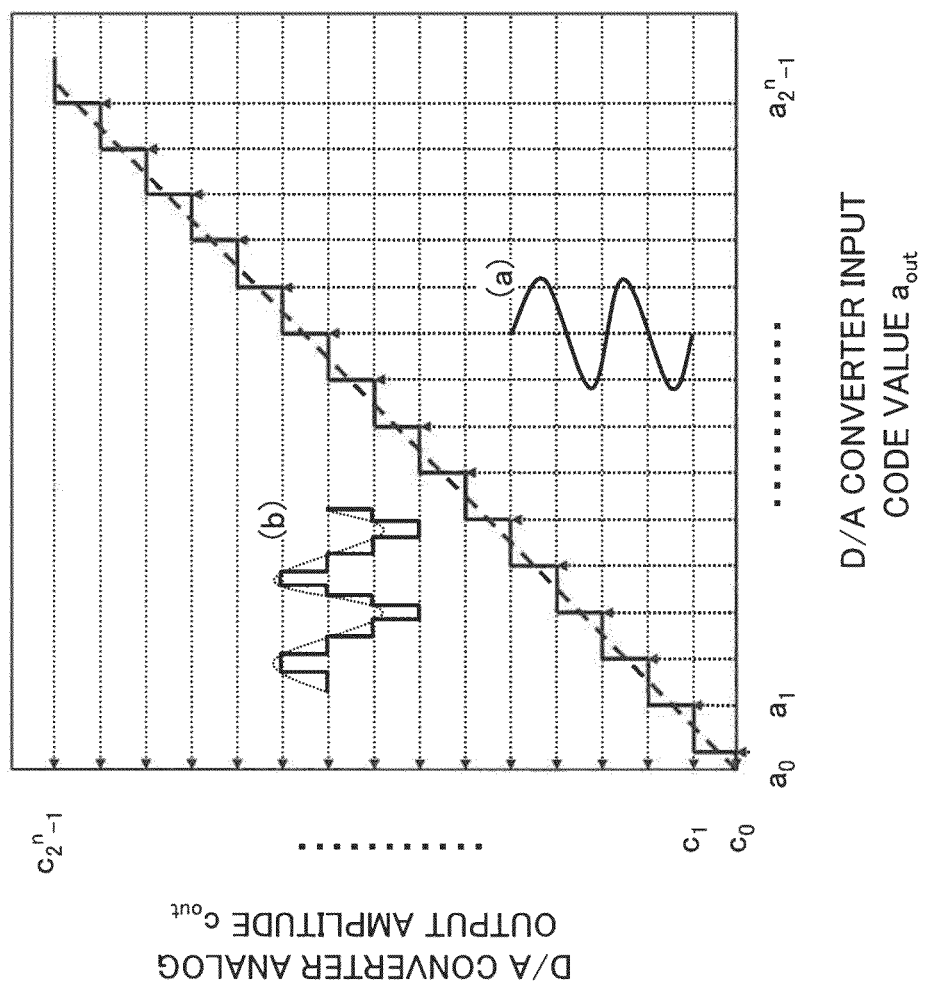
FIG. 16 is a figure to explain a transfer characteristic of a D/A converter used in a transmission device of a related technology.

First, a schematic configuration of a transmission device 1200 according to the fourth exemplary embodiment of the present invention is shown in FIG. 13. In FIG. 13, the transmission device 1200 includes an OFDM encoding circuit 1201 instead of the encoding circuit 102 and the pre-equalization operation circuit 801 and histogram monitors 1206a and the 1206b instead of the LUT 802 compared with the transmission device 80 according to the third exemplary embodiment of the present invention. The OFDM encoding circuit 1201 can include a serial-parallel conversion circuit (S/P) 1202, a symbol mapping circuit 1203, an IFFT (Inverse Fast Fourier Transform) circuit 1204, and a parallel-serial conversion circuit (P/S) 1205.

The OFDM encoding circuit 1201 performs a commonly-used OFDM encoding process to input data. For example, the OFDM encoding circuit 1201 parallelizes input data by means of the serial-parallel conversion circuit (S/P) 1202 and generates OFDM symbols by means of the symbol mapping circuit 1203. The IFFT circuit 1204 performs the inverse fast Fourier transform process on the OFDM symbols and serializes them by using the parallel-serial conversion circuit (P/S) 1205. The OFDM encoding circuit 1201 outputs two signals corresponding to a real part and an imaginary part.

The histogram monitors 1206a and 1206b monitor the amplitude frequency distribution of each output waveform from the OFDM encoding circuit 1201.

The operation of the transmission device 1200 configured above will be described. First, the OFDM encoding circuit 1201 performs the OFDM encoding on input data and outputs two signals.

Next, the histogram monitors 1206a and 1206b monitor each output waveform from the OFDM encoding circuit 1201 and output the information about the amplitude frequency distribution to the unequal-interval quantization circuits 104a and 104b. Here, the output waveform from the OFDM encoding circuit 1201 shows similar characteristics to those in the image shown in FIG. 10 which represents the appearance frequency of a power, which is proportional to the square of amplitude, per sampling point. Accordingly, the unequal-interval quantization circuits 104a and 104b can perform the quantization mapping as shown in FIG. 11.

The output level adjustment circuits 107a and 107b can adjust the output level as shown in FIG. 12. The transmission device 1200, therefore, operates as is the case with the transmission device 80 according to the third exemplary embodiment of the present invention, modulates the analog signals whose output levels are adjusted, and transmits them as optical signals.

This is the end of the explanation for the operation of the transmission device 1200.

Next, the effects of the fourth exemplary embodiment of the present invention will be described.

The transmission device according to the fourth exemplary embodiment of the present invention can transmit suitable signals preventing deterioration in transmission characteristics even though the physical resolution of the D/A converter is insufficient which is required for the transmission of the OFDM modulated signal.

The reason is because the unequal-interval quantization unit quantizes by unequal-interval each signal output from the OFDM encoding circuit based on the signal value, and then, the digital-to-analog conversion unit converts it into the analog signal. By this, it is possible for the transmission device according to the fourth exemplary embodiment of the present invention to improve the effective resolution in the area where the quantization is performed by more densely quantization level interval in comparison with a case where the output signal from the OFDM encoding circuit is directly input into the digital-to-analog conversion unit. And it is because the output level adjustment unit can maintain the linearity nearly equal to that of the ideal initial transfer function by means of adjusting the output level from each digital-to-analog conversion units so that the difference from the ideal initial transfer function which is generated by the unequal-interval quantization in the unequal-interval quantization unit may be compensated.

Although the example has been mainly described in each exemplary embodiment mentioned above in which the unequal-interval quantization unit performs the unequal-interval quantization mapping based on the amplitude frequency distribution of the output waveform from the encoding unit according to the present invention, it is only necessary for the unequal-interval quantization unit according to the present invention to perform the unequal-interval quantization mapping based on the output signal from the encoding unit of the present invention. On this occasion, it is only necessary for the unequal-interval quantization unit of the present invention to quantize densely a part of the output signal from the encoding unit of the present invention which is required to be reproduced with higher accuracy at the reception side.

It is possible to combine properly each exemplary embodiment mentioned above.

The present invention is not limited to each of the above-mentioned exemplary embodiments and can be carried out by various modes.

This application is based upon and claims the benefit of priority from Japanese patent application No. 2011-153154, filed on Jul. 11, 2011, the disclosure of which is incorporated herein in its entirety by reference.

DESCRIPTION OF THE CODES

1, 10, 70, 80, and 1200 transmission device
11 encoding unit
12 unequal-interval quantization unit
13 digital-to-analog conversion unit
14 output level adjustment unit
15 modulation unit
101 DSP
102 encoding circuit
103 waveform shaping operation circuit
104, 104a, 104b unequal-interval quantization circuit
105 quantization level adjustment circuit
106, 106a, 106b D/A converter
107, 107a, 107b output level adjustment circuit
108, 808 transfer function correction circuit
109, 109a, 109b output amplifier
110 modulator
701 waveform monitor
801 pre-equalization operation circuit
802 LUT
803 chromatic dispersion amount setting circuit
804 I/Q modulator
805 signal light source
1206a, 1206b histogram monitor
1201 OFDM encoding circuit
1202 serial-parallel conversion circuit
1203 symbol mapping circuit
1204 IFFT circuit
1205 parallel-serial conversion circuit

What is claimed is:

1. A transmission device, comprising:
an encoding unit encoding input data;
an unequal-interval quantization unit quantizing an output signal from the encoding unit by a quantization level number based on a resolution of a subsequent digital-to-analog conversion unit by using an unequally spaced quantization level interval based on the output signal;
the digital-to-analog conversion unit converting an output signal from the unequal-interval quantization unit into an analog signal;
an output level adjustment unit adjusting an output level of the digital-to-analog conversion unit so as to compensate a difference between a predetermined initial transfer function and a transfer function of the unequal-interval quantization unit; and
a modulation unit generating a transmission signal based on an output signal of the digital-to-analog conversion unit adjusted by the output level adjustment unit.

2. The transmission device according to claim 1,
wherein the encoding unit outputs a plurality of signals which correspond to an in-phase component and a quadrature phase component of a signal obtained by encoding the input data;
the unequal-interval quantization unit, the digital-to-analog conversion unit, and the output level adjustment unit are provided to each signal corresponding to the in-phase component and the quadrature phase component; and
the modulation unit generates the transmission signal based on output signals from the plurality of digital-to-analog conversion units.

3. The transmission device according to claim 2,
wherein the encoding unit comprises
an encoding circuit encoding the input data, and
a waveform shaping operation circuit performing a waveform shaping of the signal encoded by the encoding circuit; and
the unequal-interval quantization unit sets the quantization level interval in an unequally spaced interval based on a set value concerning a waveform shaping process performed by the waveform shaping operation circuit.

4. The transmission device according to claim 3,
wherein the waveform shaping operation circuit is a pre-equalization operation circuit which, based on a chromatic dispersion amount of an optical transmission line through which the transmission signal is transmitted, performs a pre-equalization process to compensate an influence of the chromatic dispersion in advance; and the unequal-interval quantization unit sets the quantization level interval in the unequally spaced interval based on the chromatic dispersion amount.

5. The transmission device according to claim 2, wherein the encoding unit comprises an OFDM (Orthogonal frequency-division multiplexing) encoding circuit.

6. The transmission device according to claim 2, wherein the unequal-interval quantization unit sets the quantization level interval in the unequally spaced interval based on an amplitude frequency distribution of a waveform shown by the output signal from the encoding unit.

7. The transmission device according to claim 2, further comprising:

a monitor unit monitoring the output signal from the encoding unit;

wherein the unequal-interval quantization unit sets the quantization level interval in the unequally spaced interval based on monitoring results of the monitor unit.

8. The transmission device according to claim 2, further comprising:

a mapping table interrelating an input value and an output value of the unequal-interval quantization unit in advance based on the quantization level interval;

wherein the unequal-interval quantization unit quantizes the output signal from the encoding unit by the unequal-interval based on the mapping table.

9. A communication system, comprising;

the transmission device according to claim 2; and a reception device receiving data transmitted from the transmission device.

10. The transmission device according to claim 1, wherein the encoding unit comprises an encoding circuit encoding the input data, and a waveform shaping operation circuit performing a waveform shaping of the signal encoded by the encoding circuit; and the unequal-interval quantization unit sets the quantization level interval in an unequally spaced interval based on a set value concerning a waveform shaping process performed by the waveform shaping operation circuit.

11. The transmission device according to claim 10, wherein the waveform shaping operation circuit is a pre-equalization operation circuit which, based on a chromatic dispersion amount of an optical transmission line through which the transmission signal is transmitted, performs a pre-equalization process to compensate an influence of the chromatic dispersion in advance; and the unequal-interval quantization unit sets the quantization level interval in the unequally spaced interval based on the chromatic dispersion amount.

12. The transmission device according to claim 1, wherein the encoding unit comprises an OFDM (Orthogonal frequency-division multiplexing) encoding circuit.

13. The transmission device according to claim 1, wherein the unequal-interval quantization unit sets the quantization level interval in the unequally spaced interval based on an amplitude frequency distribution of a waveform shown by the output signal from the encoding unit.

14. The transmission device according to claim 1, further comprising:

a monitor unit monitoring the output signal from the encoding unit;

wherein the unequal-interval quantization unit sets the quantization level interval in the unequally spaced interval based on monitoring results of the monitor unit.

15. The transmission device according to claim 1, further comprising:

a mapping table interrelating an input value and an output value of the unequal-interval quantization unit in advance based on the quantization level interval;

wherein the unequal-interval quantization unit quantizes the output signal from the encoding unit by the unequal-interval based on the mapping table.

16. A communication system, comprising;

the transmission device according to claim 1; and a reception device receiving data transmitted from the transmission device.

17. A transmission method, comprising the steps of:

encoding input data;

quantizing an encoded signal by a quantization level number based on a resolution of a subsequent digital-to-analog conversion process by using an unequally spaced quantization level interval based on the signal;

in converting an quantized signal into an analog signal, adjusting an output level of the analog signal so as to compensate a difference between a transfer function expressing an unequal-interval quantization and an initial transfer function set in advance; and generating a transmission signal based on an adjusted analog signal.

* * * * *